(12) United States Patent
Chang et al.

(10) Patent No.: US 11,935,781 B2
(45) Date of Patent: *Mar. 19, 2024

(54) INTEGRATED CIRCUIT STRUCTURE WITH BACKSIDE DIELECTRIC LAYER HAVING AIR GAP

(71) Applicant: Taiwan Semiconductor Manufacturing Co., Ltd., Hsinchu (TW)

(72) Inventors: Che-Lun Chang, Hsinchu (TW); Wei-Yang Lee, Taipei (TW); Chia-Pin Lin, Xinpu Township (TW); Yuan-Ching Peng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/815,669

(22) Filed: Jul. 28, 2022

(65) Prior Publication Data

US 2022/0367243 A1    Nov. 17, 2022

Related U.S. Application Data

(63) Continuation of application No. 17/149,918, filed on Jan. 15, 2021, now Pat. No. 11,450,559.

(Continued)

(51) Int. Cl.
*H01L 21/768*    (2006.01)
*H01L 21/306*    (2006.01)

(Continued)

(52) U.S. Cl.
CPC ...... *H01L 21/7682* (2013.01); *H01L 21/7624* (2013.01); *H01L 21/76804* (2013.01);
(Continued)

(58) Field of Classification Search
CPC ........... H01L 21/7682; H01L 21/76804; H01L 21/76805; H01L 29/41733; H01L 23/5226;
(Continued)

(56) References Cited

U.S. PATENT DOCUMENTS 9,997,443 B2    6/2018    Brech et al.
11,450,559 B2 *  9/2022    Chang ............... H01L 21/76897
(Continued)

FOREIGN PATENT DOCUMENTS

JP    2019526926 A    9/2019
KR    20190036521 A    4/2019
TW    201943037 A    11/2019

*Primary Examiner* — Changhyun Yi
(74) *Attorney, Agent, or Firm* — Slater Matsil, LLP

(57) ABSTRACT

An integrated circuit (IC) structure includes a gate structure, a source epitaxial structure, a drain epitaxial structure, a front-side interconnection structure, a backside dielectric layer, and a backside via. The source epitaxial structure and the drain epitaxial structure are respectively on opposite sides of the gate structure. The front-side interconnection structure is on a front-side of the source epitaxial structure and a front-side of the drain epitaxial structure. The backside dielectric layer is on a backside of the source epitaxial structure and a backside of the drain epitaxial structure and has an air gap therein. The backside via extends through the backside dielectric layer to a first one of the source epitaxial structure and the drain epitaxial structure.

20 Claims, 40 Drawing Sheets

Related U.S. Application Data

(60) Provisional application No. 63/017,141, filed on Apr. 29, 2020.

(51) Int. Cl.

| | |
|---|---|
| *H01L 21/762* | (2006.01) |
| *H01L 23/522* | (2006.01) |
| *H01L 23/532* | (2006.01) |
| *H01L 29/06* | (2006.01) |
| *H01L 29/08* | (2006.01) |
| *H01L 29/417* | (2006.01) |
| *H01L 29/423* | (2006.01) |
| *H01L 29/45* | (2006.01) |
| *H01L 29/66* | (2006.01) |
| *H01L 29/786* | (2006.01) |

(52) U.S. Cl.
CPC .... *H01L 21/76805* (2013.01); *H01L 23/5226* (2013.01); *H01L 23/5329* (2013.01); *H01L 29/41733* (2013.01); *H01L 29/66439* (2013.01); *H01L 29/66742* (2013.01); *H01L 21/30604* (2013.01); *H01L 29/0673* (2013.01); *H01L 29/0847* (2013.01); *H01L 29/42392* (2013.01); *H01L 29/45* (2013.01); *H01L 29/78696* (2013.01)

(58) Field of Classification Search
CPC ........... H01L 21/7624; H01L 29/42392; H01L 21/30604; H01L 21/76897; H01L 29/78696; H01L 29/45; H01L 29/0847; H01L 29/0673; H01L 29/66742; H01L 29/66439
See application file for complete search history.

(56) References Cited

U.S. PATENT DOCUMENTS

| | | |
|---|---|---|
| 2019/0304900 A1 | 10/2019 | Chen et al. |
| 2019/0348498 A1 | 11/2019 | Cheng et al. |
| 2020/0111886 A1 | 4/2020 | Ando et al. |
| 2021/0098294 A1* | 4/2021 | Smith ............... H01L 21/76895 |

* cited by examiner

INTEGRATED CIRCUIT STRUCTURE WITH BACKSIDE DIELECTRIC LAYER HAVING AIR GAP

PRIORITY CLAIM AND CROSS-REFERENCE

This application is a continuation of U.S. patent application Ser. No. 17/149,918, filed on Jan. 15, 2021, now U.S. Pat. No. 11,450,559, issued Sep. 20, 2022, entitled "Integrated Circuit Structure with Backside Dielectric Layer Having Air Gap," which claims the benefit of U.S. Provisional Application No. 63/17,141, filed on Apr. 29, 2020, entitled "Backside Air Dielectric Structure," each application is hereby incorporated by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
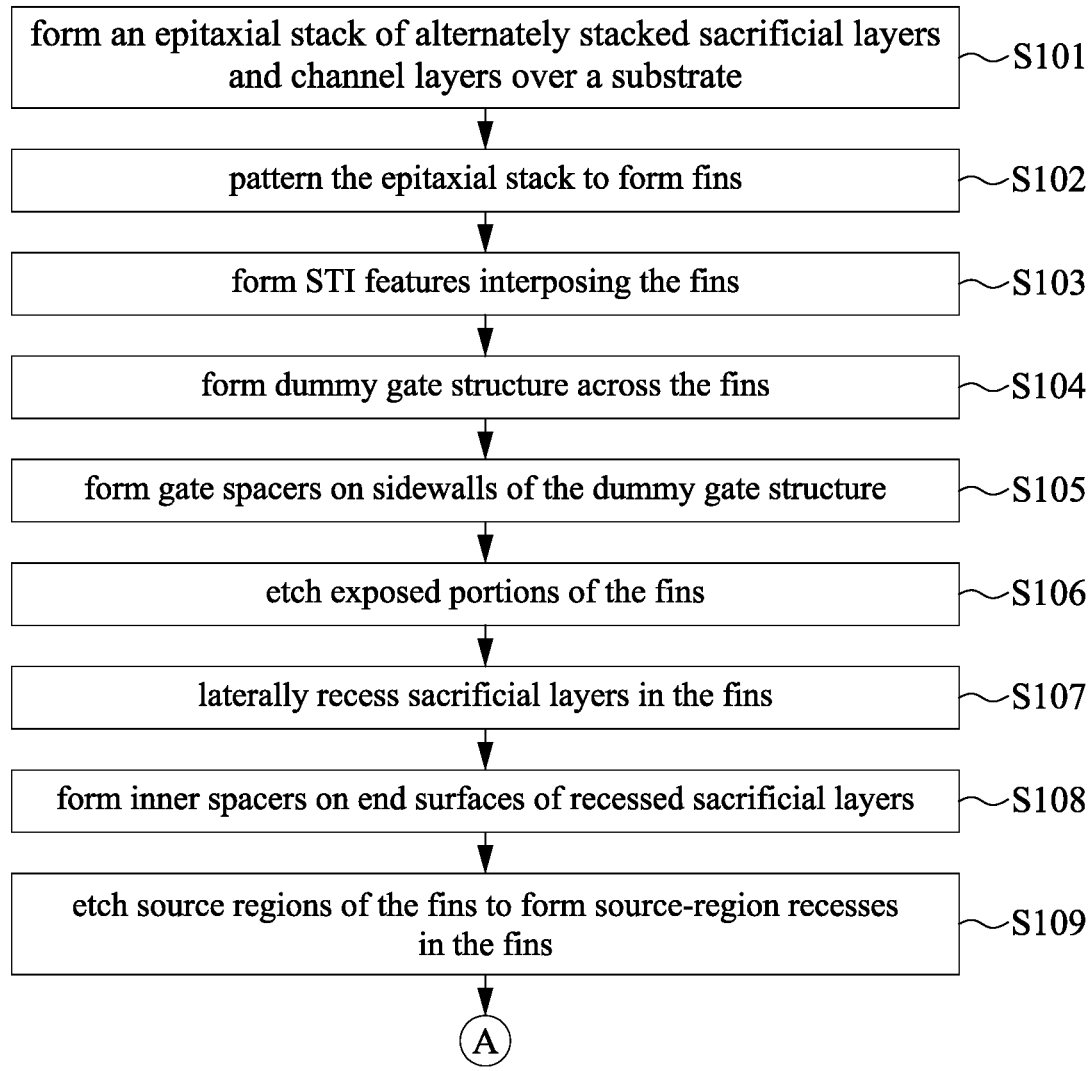
FIGS. 1A-1C is a flow chart illustrating a method of forming an integrated circuit structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating gate-all-around (GAA) transistors with backside vias below source regions and/or drain regions of the GAA transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In order to create more routing space for an integrated circuit (IC) structure having a large number of GAA transistors, backside power rails connected to backside of source regions of GAA transistors using backside metal vias are being studied as an alternative to front-side power rails formed on front-side of source regions of transistors. However, resistance capacitance (RC) time delay might be increased due to shortened distances among the backside metal vias, thereby degrading device performance of GAA transistors. Therefore, in some embodiments of the present disclosure, a backside interlayer dielectric (ILD) layer having one or more air gaps is formed around the backside metal vias. One advantageous feature having the air gaps is that air in the air gap exhibits a relative permittivity (or called dielectric constant) approximately equal to 1. Such a low dielectric constant helps to reduce the capacitive coupling between adjacent backside vias. Such reduced capacitive coupling may help to improve reliability characteristics.

Figure 1B:
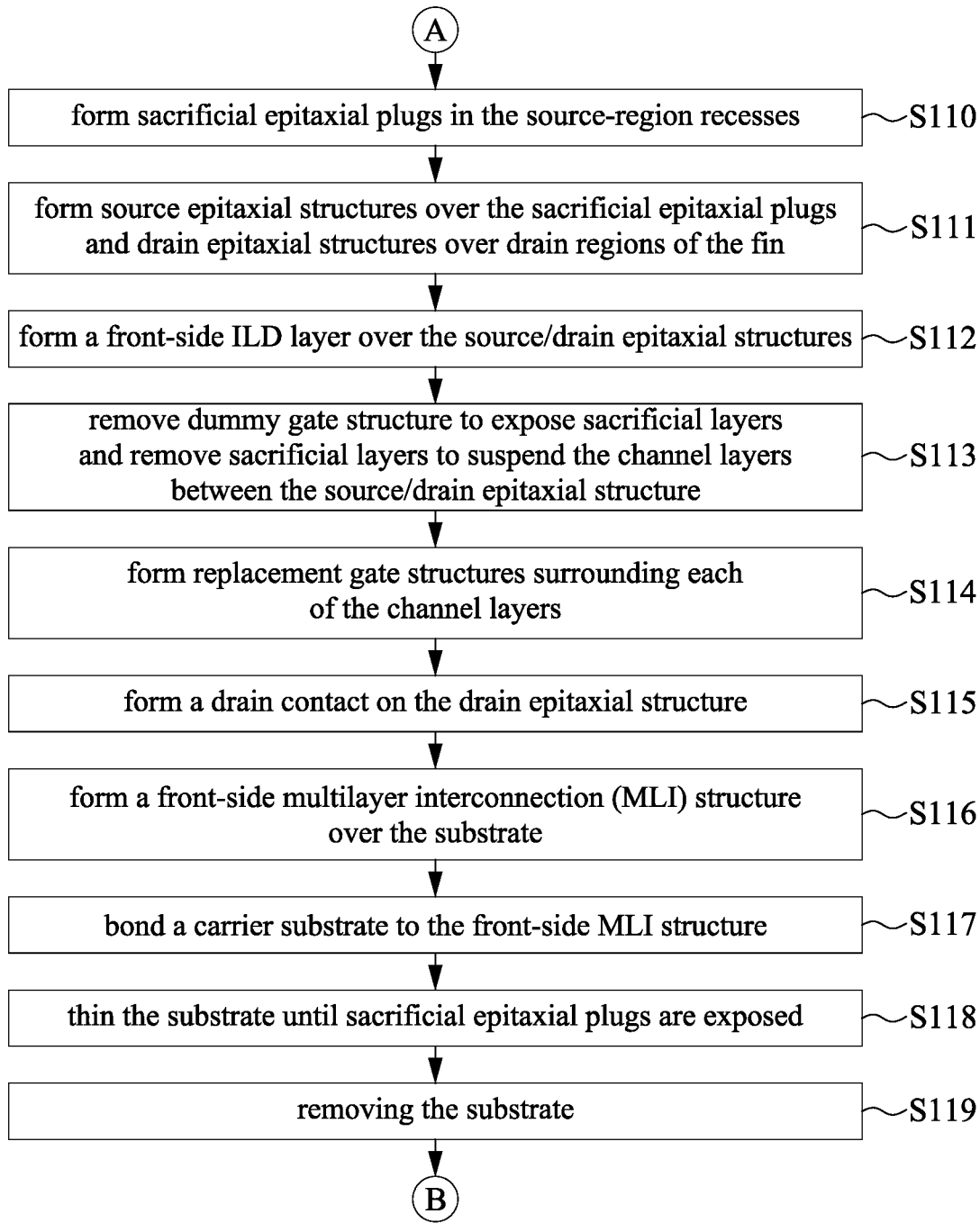
Figure 1C:
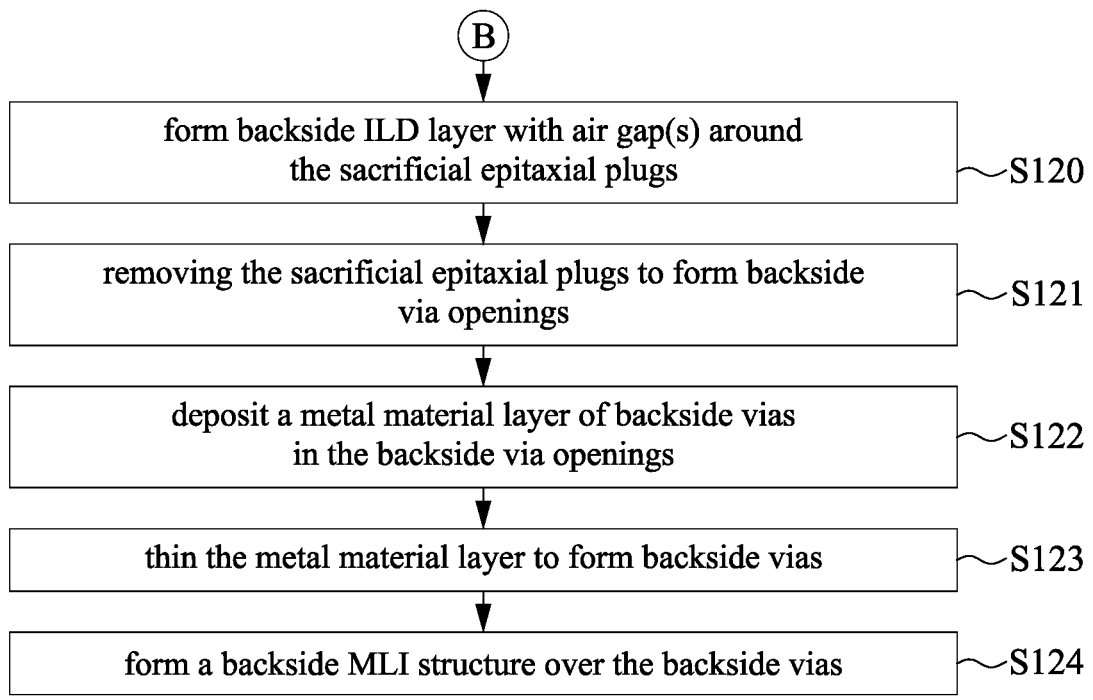

Illustrated in FIGS. 1A-1C is a method M1 of semiconductor fabrication including fabrication of an integrated circuit structure having multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

FIGS. 2, 3, 4, 5A, 6A, 7A and 8A are perspective views of some embodiments of an integrated circuit structure 100 at intermediate stages of the method M1 of FIGS. 1A-1C. FIGS. 5B, 6B, 7B, 8B, 9-13, 14A, 15-25 are cross-sectional views of some embodiments of the integrated circuit structure 100 at intermediate stages of the method M1 along a first cut (e.g., cut X-X in FIG. 5A), which is along a lengthwise direction of the channel and perpendicular to a top surface of the substrate. FIG. 14B is a cross-sectional view of some embodiments of the integrated circuit structure 100 at intermediate stages of the method M1 along a second cut (e.g., cut Y-Y in FIG. 5A), which is in the gate region and perpendicular to the lengthwise direction of the channel.

As with the other method embodiments and exemplary devices discussed herein, it is understood that parts of the integrated circuit structure 100 may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs, etc., which may be interconnected. Moreover, it is noted that the process steps of method M1, including any descriptions given with reference to FIGS. 2-25, as with the remainder of the method and exemplary figures provided in this disclosure, are merely exemplary and are not intended to be limiting beyond what is specifically recited in the claims that follow.

Referring to FIG. 1A, the method M1 begins at step S101 where one or more epitaxial layers are grown on a substrate. Referring to the example of FIG. 2, in some embodiments of step S101, an epitaxial stack 120 is formed over the substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below.

Figure 2:
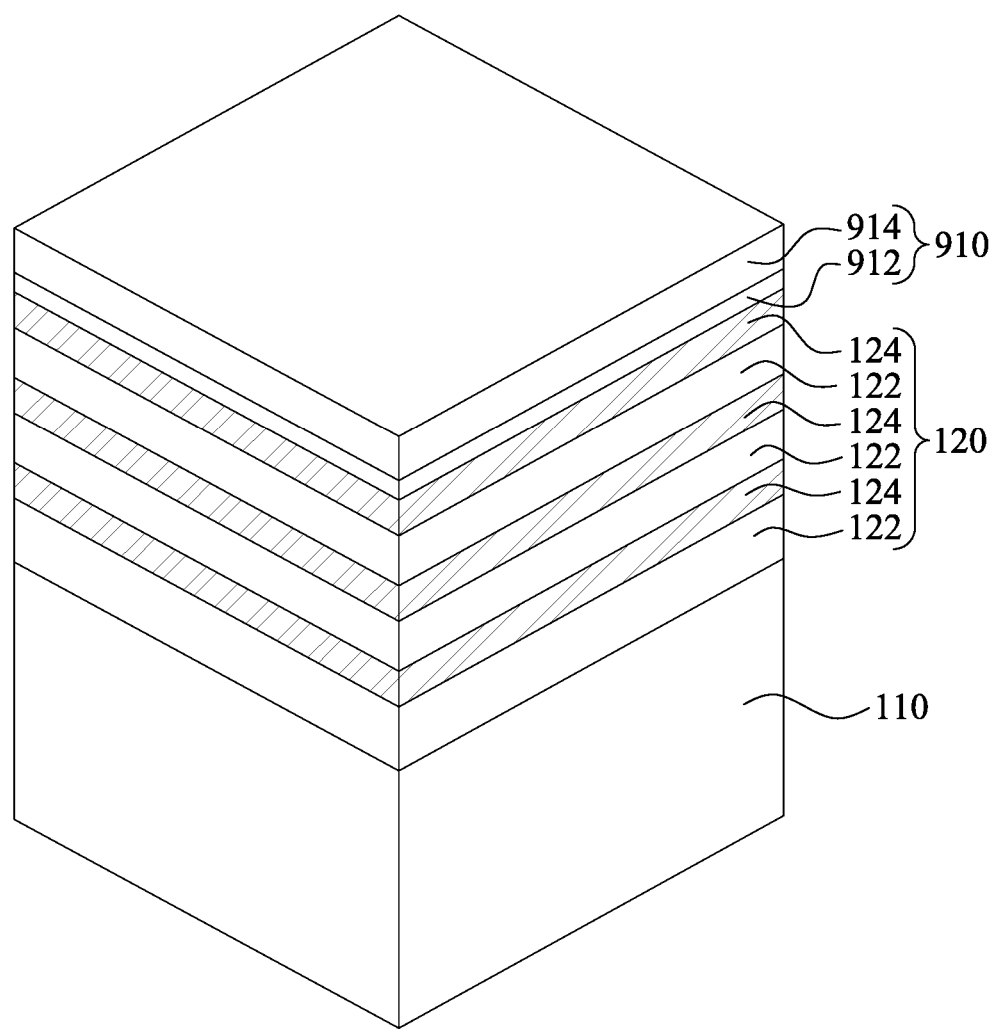
FIGS. 2, 3, 4, 5A, 6A, 7A and 8A are perspective views of some embodiments of an integrated circuit structure at intermediate stages of the method of FIGS. 1A-1C.
Figure 2:
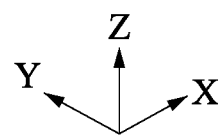

It is noted that three layers of the epitaxial layers 122 and three layers of the epitaxial layers 124 are alternately arranged as illustrated in FIG. 2, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, each epitaxial layer 122 has a thickness ranging from about 1 nanometers (nm) to about 10 nm, but other ranges are within the scope of various embodiments of the present disclosure. The epitaxial layers 122 may be substantially uniform in thickness. In some embodiments, each epitaxial layer 124 has a thickness ranging from about 1 nm to about 10 nm, but other ranges are within the scope of various embodiments of the present disclosure. In some embodiments, the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

The method M1 then proceeds to step S102 where semiconductor fins are formed by patterning. With reference to the example of FIG. 3, in some embodiments of block S102, a plurality of semiconductor fins 130 extending from the substrate 110 are formed. In various embodiments, each of the fins 130 includes a substrate portion 112 formed from the substrate 110 and portions of each of the epitaxial layers of the epitaxial stack including epitaxial layers 122 and 124. The fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120. The etching process can include dry etching, wet etching, reactive ion etching (RIE), and/or other suitable processes.

Figure 3:
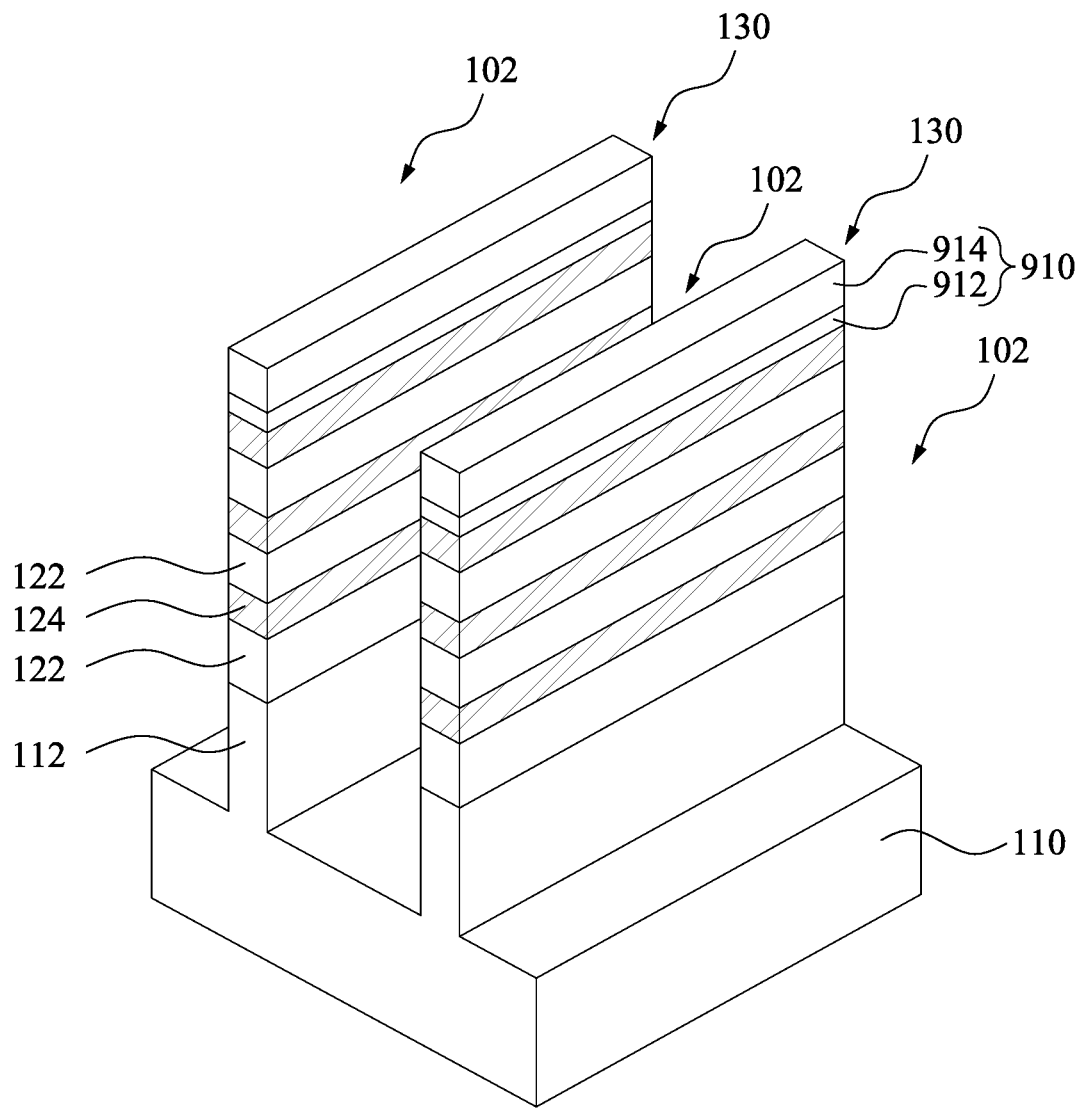

In the illustrated embodiment as illustrated in FIGS. 2 and 3, a hard mask (HM) layer 910 is formed over the epitaxial stack 120 prior to patterning the fins 130. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms trenches 102 in unprotected regions through the HM layer 910, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130.

Figure 4:
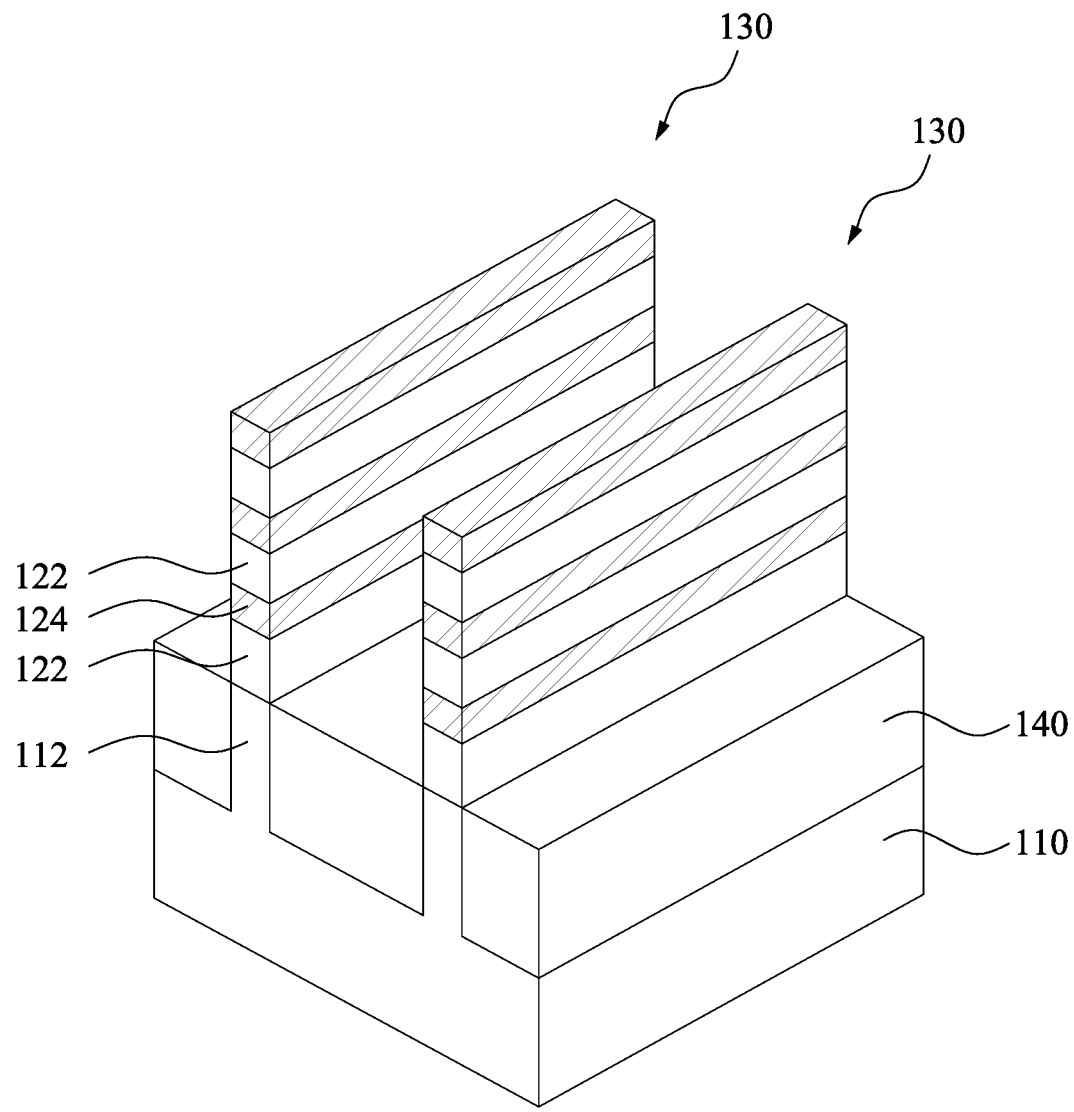

Referring to FIGS. 1A and 4, the method M1 proceeds to step S103 by forming shallow trench isolation (STI) features 140 interposing the fins 130. By way of example and not limitation, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the integrated circuit structure 100 may be annealed, for example, to improve the quality of the dielectric layer. In some embodiments, the dielectric layer (and subsequently formed STI features 140) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 910 (as illustrated FIG. 3) functions as a CMP stop layer. The STI features 140 interposing the fins 130 are recessed. Referring to the example of FIG. 4, the STI features 140 are recessed providing the fins 130 extending above the STI features 140. In some embodiments, the recessing process may include a dry etching process, a wet etching process, and/or a combination thereof. The HM layer 910 may also be removed before, during, and/or after the recessing of the STI features 140. The nitride layer 914 of the HM layer 910 may be removed, for example, by a wet etching process using $H_3PO_4$ or other suitable etchants. In some embodiments, the oxide layer 912 of the HM layer 910 is removed by the same etchant used to recess the STI features 140. In some embodiments, a recessing depth is controlled (e.g., by controlling an etching time) so as to result in a desired height of the exposed upper portion of the fins 130. In the illustrated embodiment, the desired height exposes each of the layers of the epitaxial stack 120 in the fins 130.

The method M1 then proceeds to step S104 where sacrificial layers/features are formed and in particular, a dummy gate structure. While the present discussion is directed to a replacement gate process whereby a dummy gate structure is formed and subsequently replaced, other configurations may be possible.

Figure 5A:
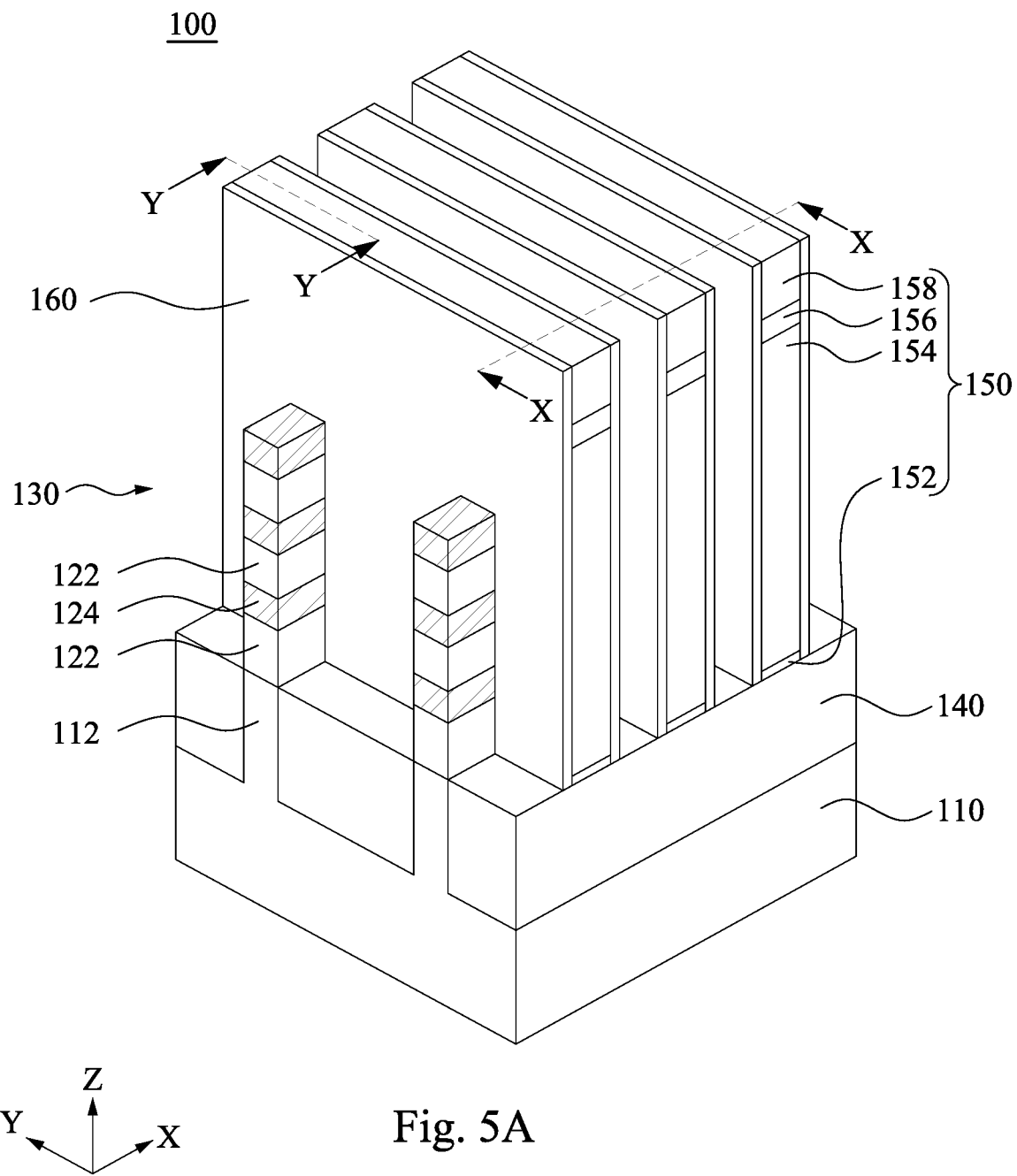
Figure 5B:
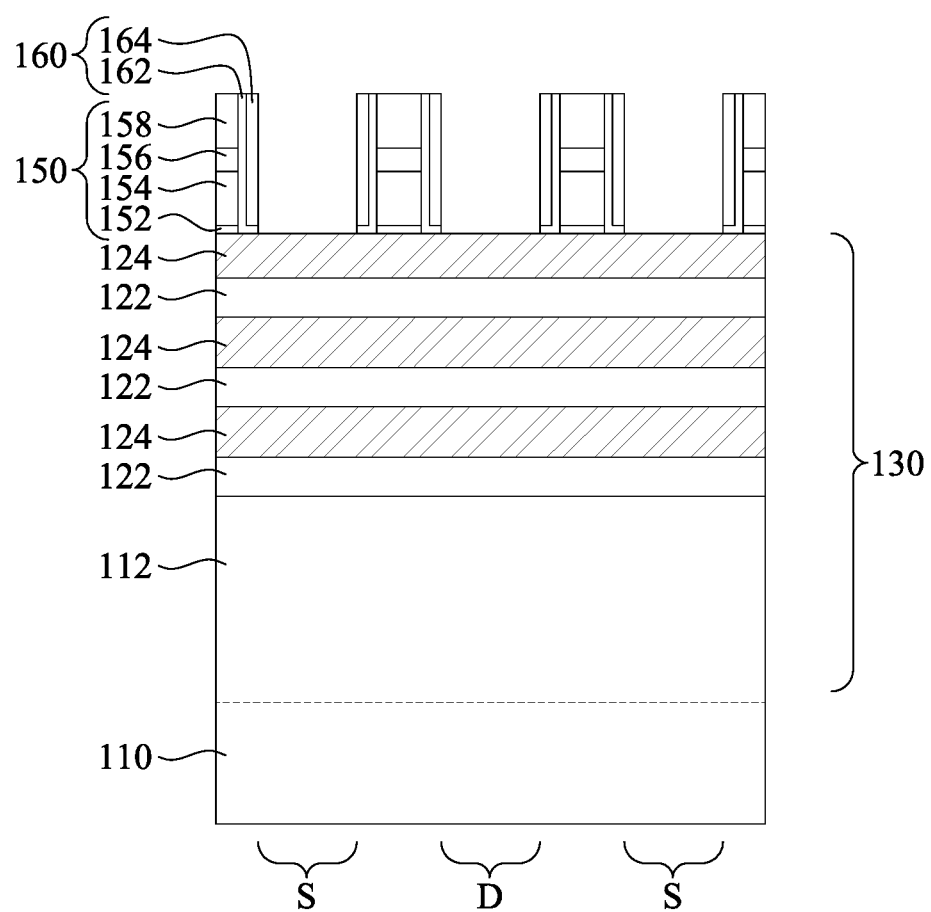
FIGS. 5B, 6B, 7B, 8B, 9-13, 14A, 15-25 are cross-sectional views of some embodiments of the integrated circuit structure at intermediate stages of the method of FIGS. 1A-1C along a first cut.

With reference to FIGS. 5A and 5B, a gate structure 150 is formed. In some embodiments, the gate structure 150 is a dummy (sacrificial) gate structure that is subsequently removed. Thus, in some embodiments using a gate-last process, the gate structure 150 is a dummy gate structure and will be replaced by the final gate structure at a subsequent processing stage of the integrated circuit structure 100. In particular, the dummy gate structure 150 may be replaced at a later processing stage by a high-k dielectric layer (HK) and metal gate electrode (MG) as discussed below. In some embodiments, the dummy gate structure 150 is formed over the substrate 110 and is at least partially disposed over the fins 130. The portion of the fins 130 underlying the dummy gate structure 150 may be referred to as the channel region. The dummy gate structure 150 may also define a source/drain (S/D) region of the fins 130, for example, the regions of the fin 130 adjacent and on opposing sides of the channel region.

In the illustrated embodiment, step S104 first forms a dummy gate dielectric layer 152 over the fins 130. In some embodiments, the dummy gate dielectric layer 152 may include $SiO_2$, silicon nitride, a high-k dielectric material and/or other suitable material. In various examples, the dummy gate dielectric layer 152 may be deposited by a CVD process, a subatmospheric CVD (SACVD) process, a flowable CVD process, an ALD process, a PVD process, or other suitable process. By way of example, the dummy gate dielectric layer 152 may be used to prevent damages to the fins 130 by subsequent processes (e.g., subsequent formation of the dummy gate structure). Subsequently, step S104 forms other portions of the dummy gate structure 150, including a dummy gate electrode layer 154 and a hard mask which may include multiple layers 156 and 158 (e.g., an oxide layer 156 and a nitride layer 158). In some embodiments, the dummy gate structure 150 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 154 may include polycrystalline silicon (polysilicon). In some embodiments, the hard mask includes an oxide layer 156 such as a pad oxide layer that may include $SiO_2$, and a nitride layer 158 such as a pad nitride layer that may include $Si_3N_4$ and/or silicon oxynitride. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, the oxide layer 156 and the nitride layer 158.

Referring to FIG. 1A, the method M1 then proceeds to step S105 where gate spacers are formed on sidewalls of the dummy gate structures. As illustrated in FIGS. 5A and 5B, in some embodiments of step S105, a spacer material layer is deposited on the substrate. The spacer material layer may be a conformal layer that is subsequently etched back to form gate sidewall spacers. In the illustrated embodiment, a spacer material layer 160 is disposed conformally on top and sidewalls of the dummy gate structure 150. The spacer material layer 150 may include a dielectric material such as silicon oxide, silicon nitride, silicon carbide, silicon oxynitride, SiCN films, silicon oxycarbide, SiOCN films, and/or combinations thereof. In some embodiments, the spacer material layer 160 includes multiple layers, such as a first spacer layer 162 and a second spacer layer 164 (illustrated in FIG. 5B) formed over the first spacer layer 162. By way of example, the spacer material layer 160 may be formed by depositing a dielectric material over the gate structure 150 using processes such as, CVD process, a subatmospheric CVD (SACVD) process, a flowable CVD process, an ALD process, a PVD process, or other suitable process. An anisotropic etching process is then performed on the deposited spacer material layer 160 to expose portions of the fins 130 not covered by the dummy gate structure 150 (e.g., in source/drain regions of the fins 130). Portions of the spacer material layer directly above the dummy gate structure 150 may be completely removed by this anisotropic etching process. Portions of the spacer material layer on sidewalls of the dummy gate structure 150 may remain, forming gate sidewall spacers, which is denoted as the gate spacers 160, for the sake of simplicity. It is noted that although the gate spacers 160 are multi-layer structures in the cross-sectional view of FIG. 5B, they are illustrated as single-layer structures in the perspective view of FIG. 5A for the sake of simplicity.

Figure 6A:
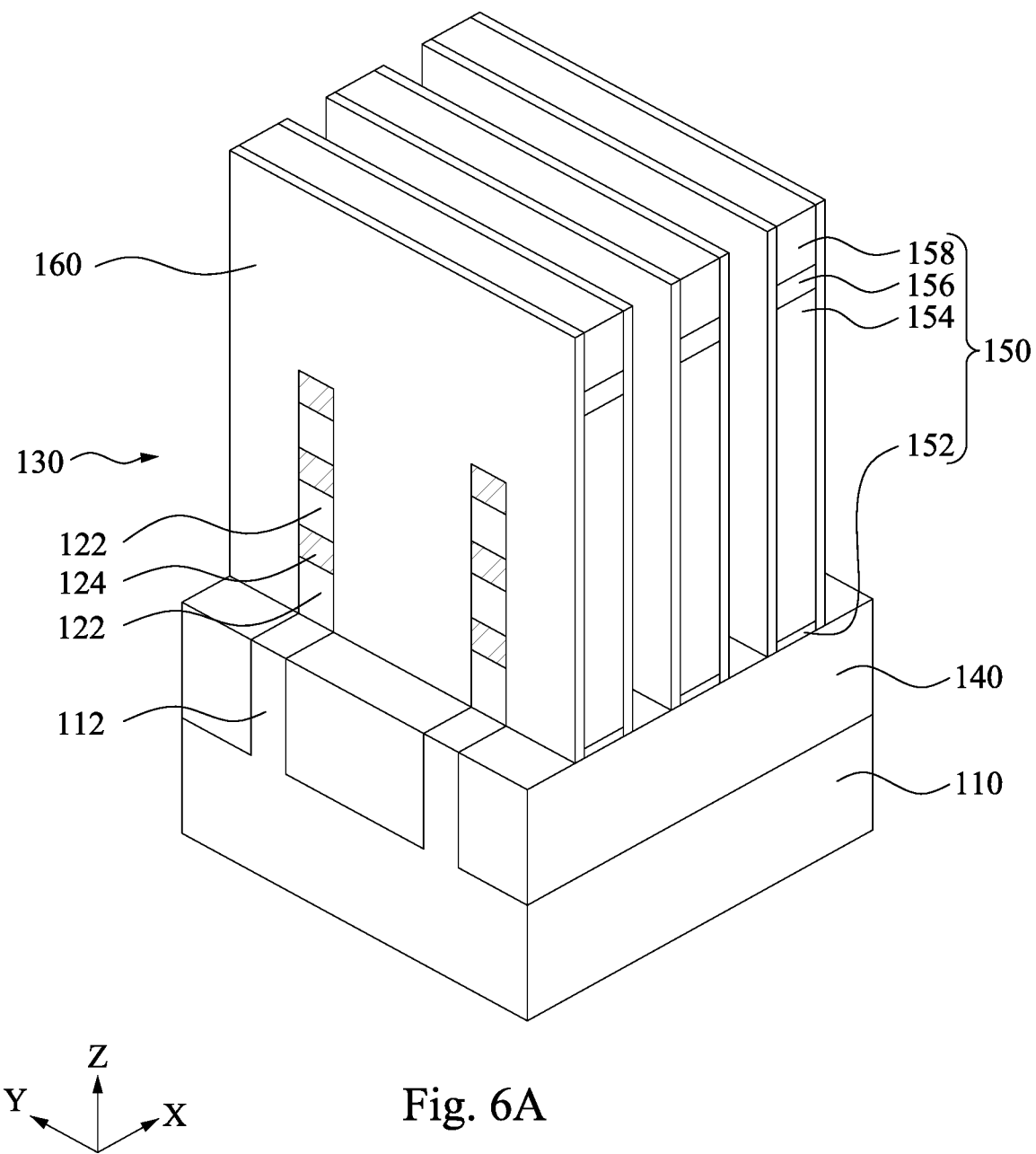
Figure 6B:
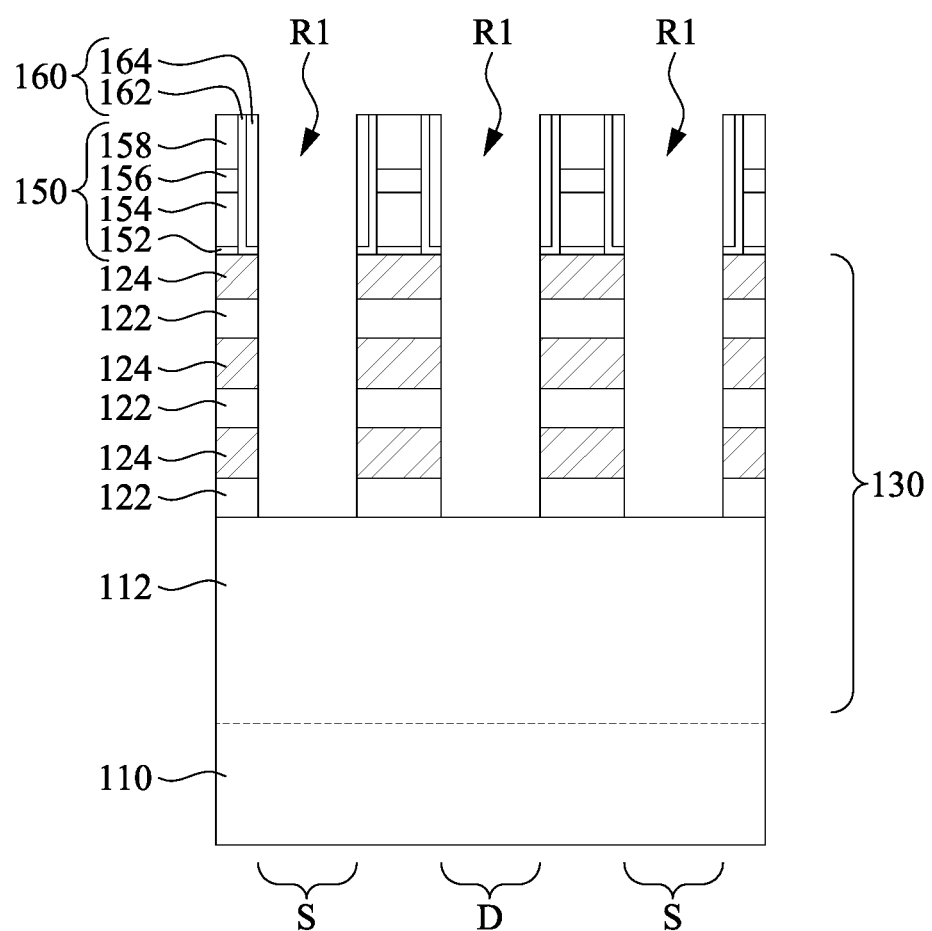

Referring to FIG. 1A, the method M1 then proceeds to step S106 where exposed portions of the fins are removed. With reference to FIGS. 6A and 6B, in some embodiments of step S106, exposed portions of the semiconductor fins 130 that extend laterally beyond the gate spacers 160 (e.g., in source/drain regions of the fins 130) are etched by using, for example, an anisotropic etching process that uses the dummy gate structure 150 and the gate spacers 160 as an etch mask, resulting in recesses R1 into the semiconductor fins 130 and between corresponding dummy gate structures 150. After the anisotropic etching, end surfaces of the sacrificial layers 122 and channel layers 124 are aligned with respective outermost sidewalls of the gate spacers 160, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 7A:
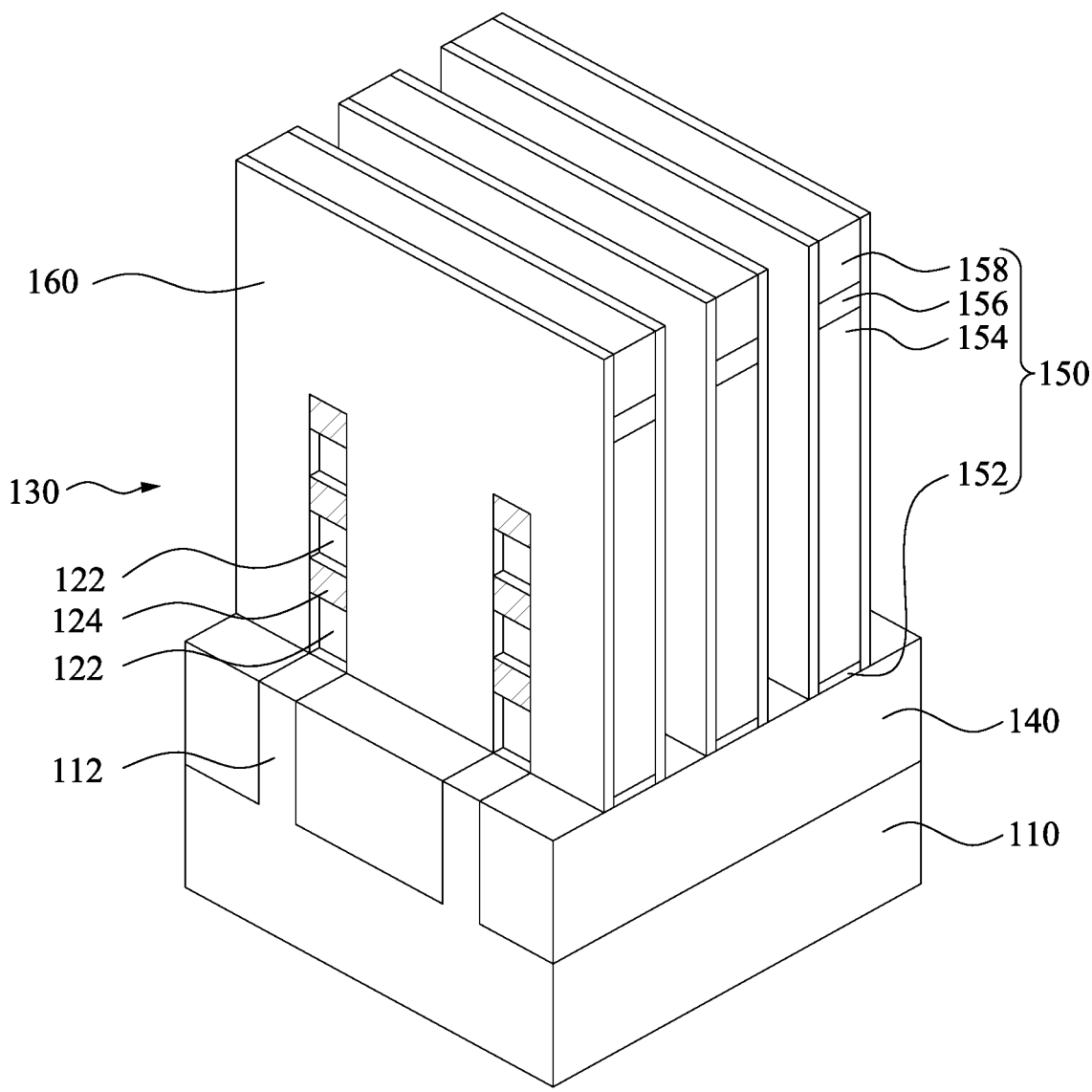
Figure 7B:
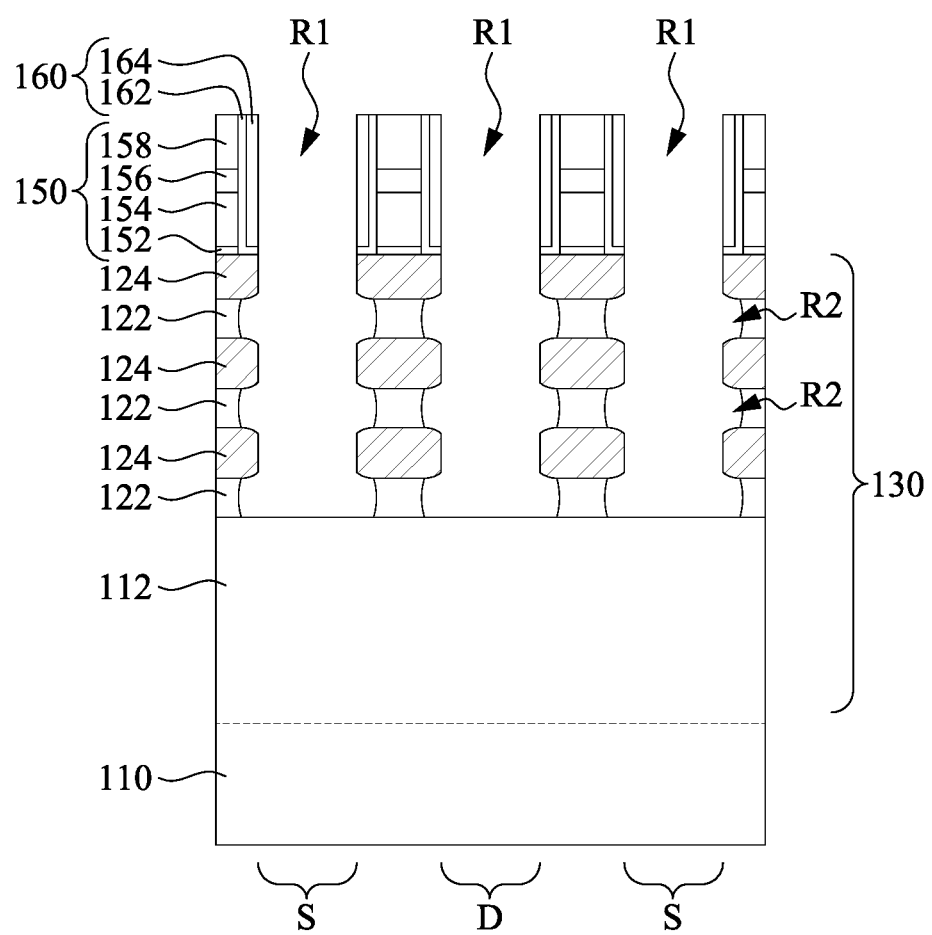

Referring to FIG. 1A, the method M1 then proceeds to step S107 where the sacrificial layers 122 are laterally recessed. With reference to FIGS. 7A and 7B, in some embodiments of step S107, the sacrificial layers 122 are laterally or horizontally recessed by using suitable etch techniques, resulting in lateral recesses R2 each vertically between corresponding channel layers 124. Step S107 may be performed by using a selective etching process. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 is not significantly etched by the process of laterally recessing the sacrificial layers 122. As a result, the channel layers 124 laterally extend past opposite end surfaces of the sacrificial layers 122.

Figure 8A:
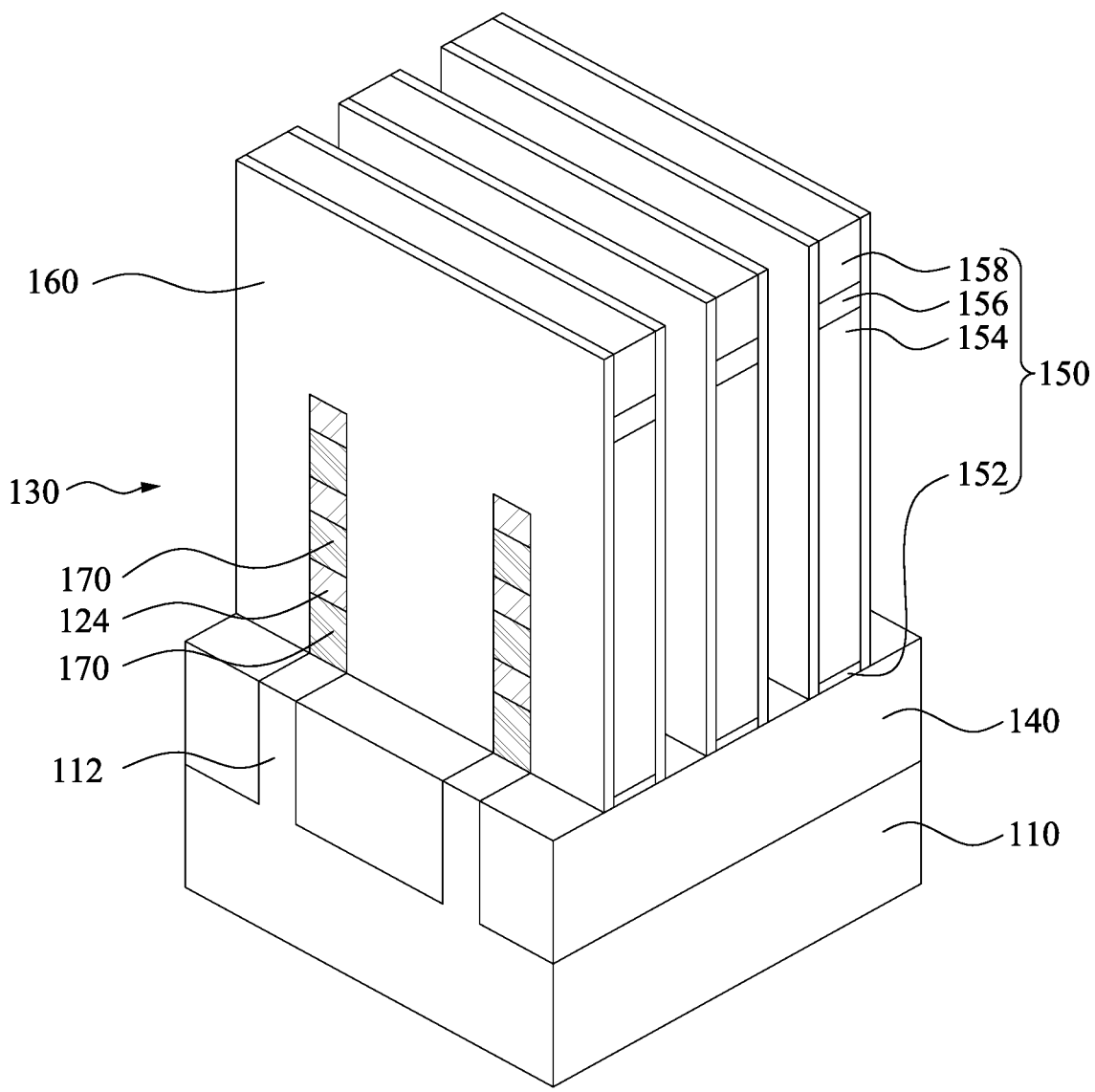
Figure 8B:
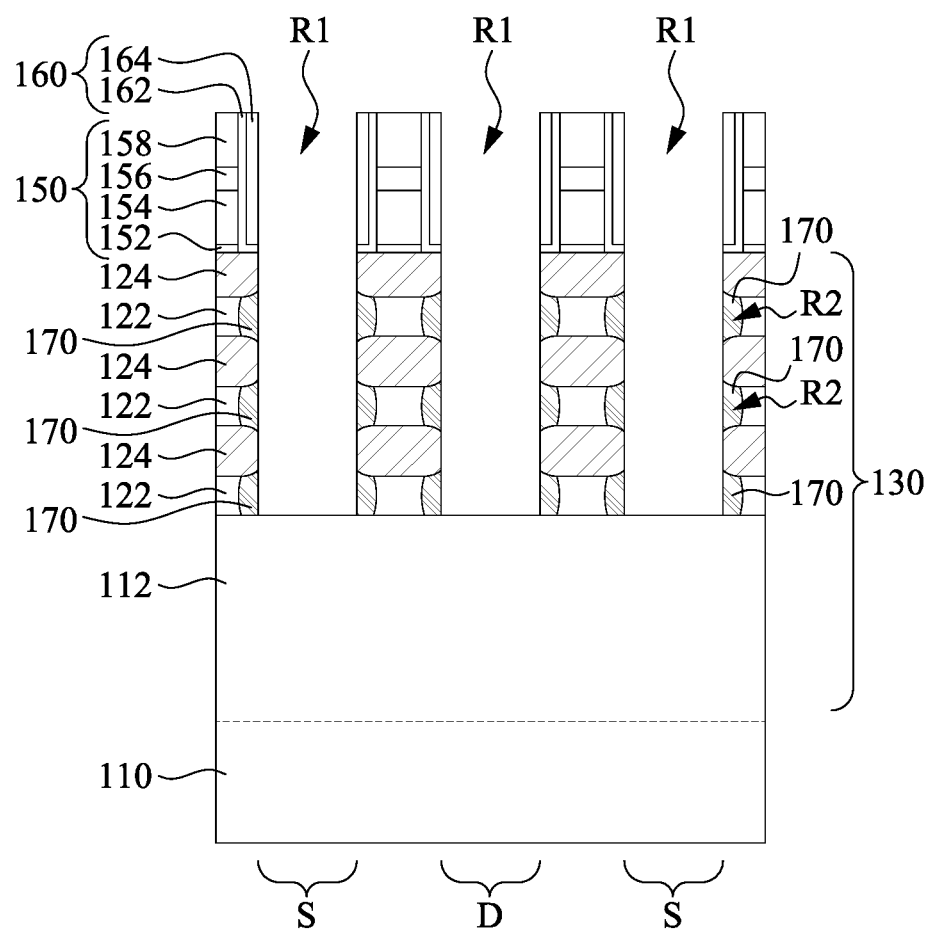

Referring to FIG. 1A, the method M1 then proceeds to step S108 where the inner spacers are formed on opposite end surfaces of the laterally recessed sacrificial layers. As illustrated in FIGS. 8A and 8B, in some embodiments of step S108, an inner spacer material layer 170 is formed to fill the recesses R2 left by the lateral etching of the sacrificial layers 122 discussed above with reference to FIGS. 7A and 7B. The inner spacer material layer 170 may be a low-K dielectric material, such as $SiO_2$, SiN, SiCN, or SiOCN, and may be formed by a suitable deposition method, such as ALD. After the deposition of the inner spacer material layer 170, an anisotropic etching process may be performed to trim the deposited inner spacer material 170, such that only portions of the deposited inner spacer material 170 that fill the recesses R2 left by the lateral etching of the sacrificial layers 122 are left. After the trimming process, the remaining portions of the deposited inner spacer material are denoted as inner spacers 170, for the sake of simplicity. The inner spacers 170 serve to isolate metal gates from source/drain regions formed in subsequent processing. In the example of FIGS. 8A and 8B, sidewalls of the inner spacers 170 are aligned with sidewalls of the channel layers 124.

Figure 9:
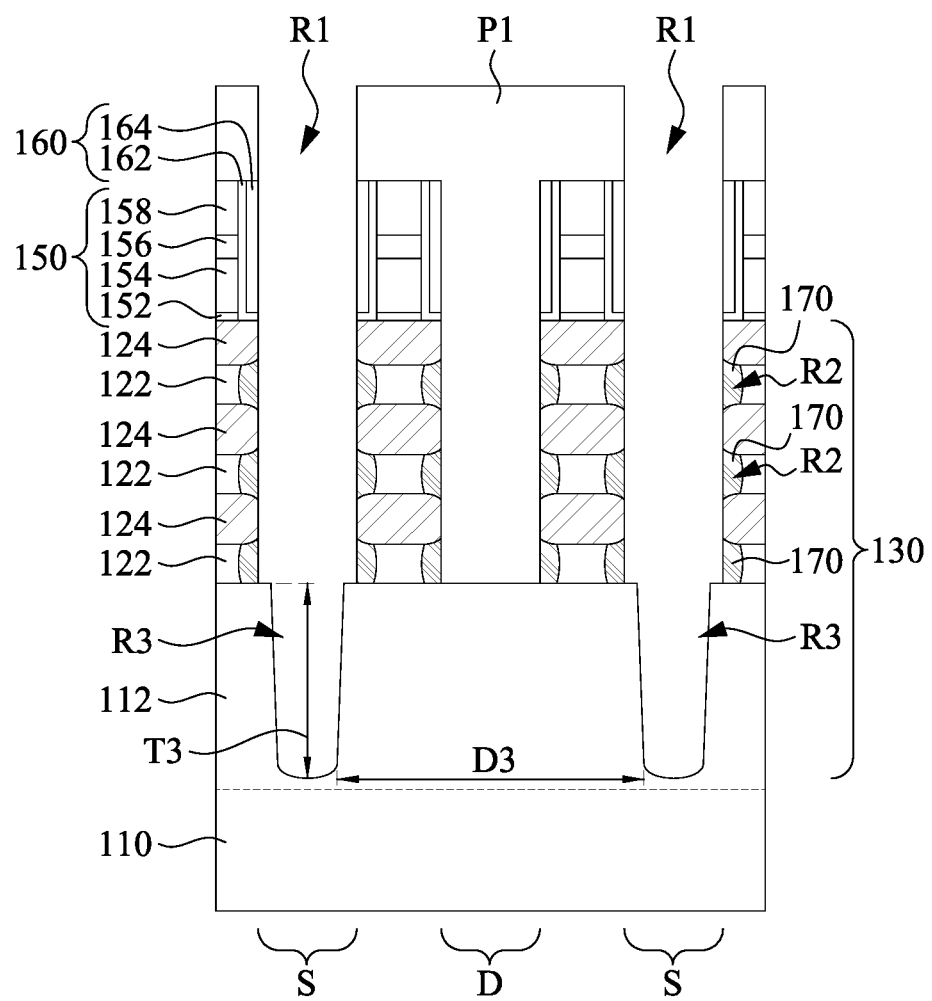

Referring to FIG. 1A, the method M1 then proceeds to step S109 where source regions of the fins are further recessed. With reference to FIG. 9, in some embodiments of step S109, a patterned mask P1 is first formed to cover drain regions D of the fins 130 but not cover source regions S of the fins 130, and then the source regions S of the fins 130 are recessed, resulting in source-region recesses R3 in the semiconductor fins 130. In some embodiments, the patterned mask P1 may be a photoresist mask formed by suitable photolithography process. For example, the photolithography process may include spin-on coating a photoresist layer over the structure as illustrated in FIGS. 8A and 8B, performing post-exposure bake processes, and developing the photoresist layer to form the patterned mask P1. In some embodiments, patterning the resist to form the patterned mask element may be performed using an electron beam (e-beam) lithography process or an extreme ultraviolet (EUV) lithography process.

Once the patterned mask P1 is formed, the source-region recesses R3 can be formed in the source regions S using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 20:
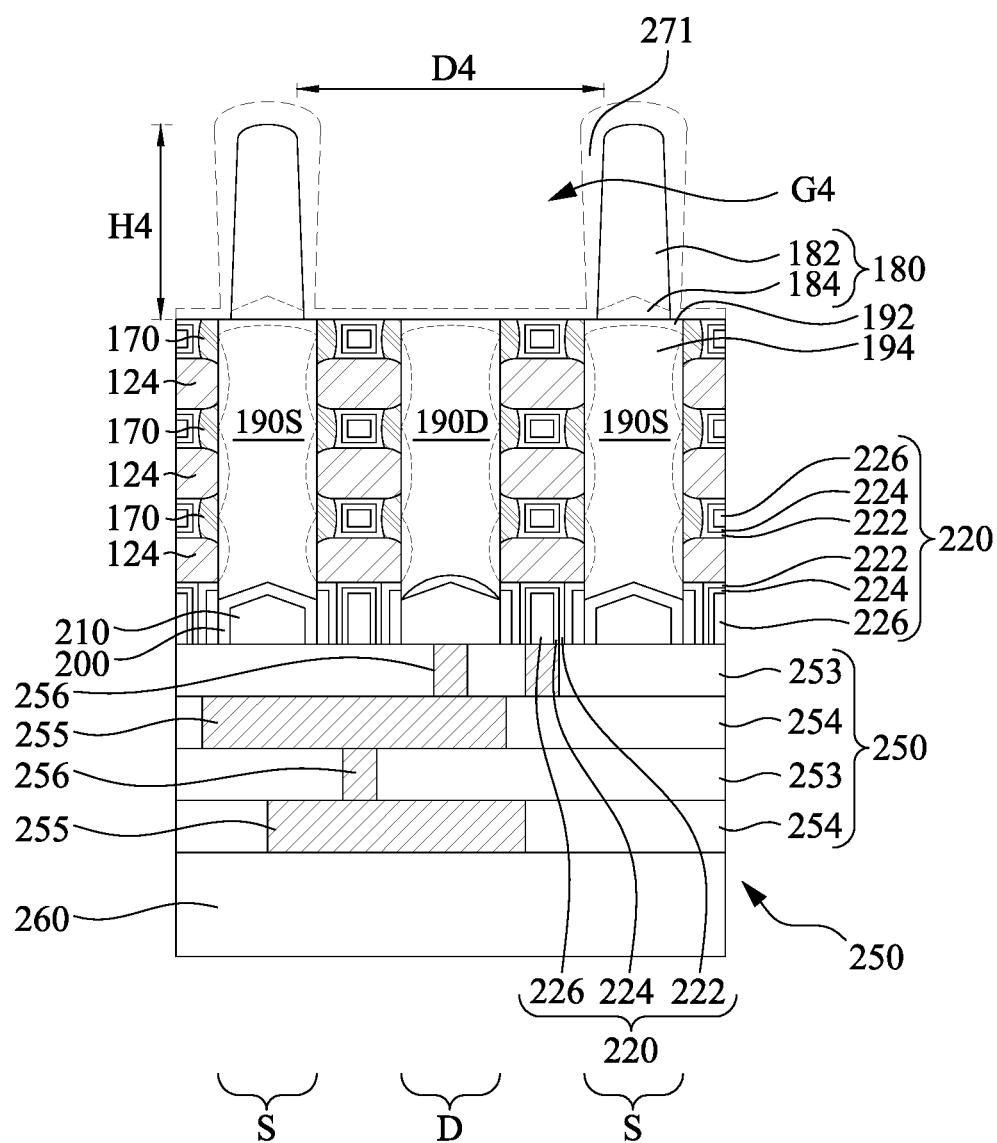
Figure 21:
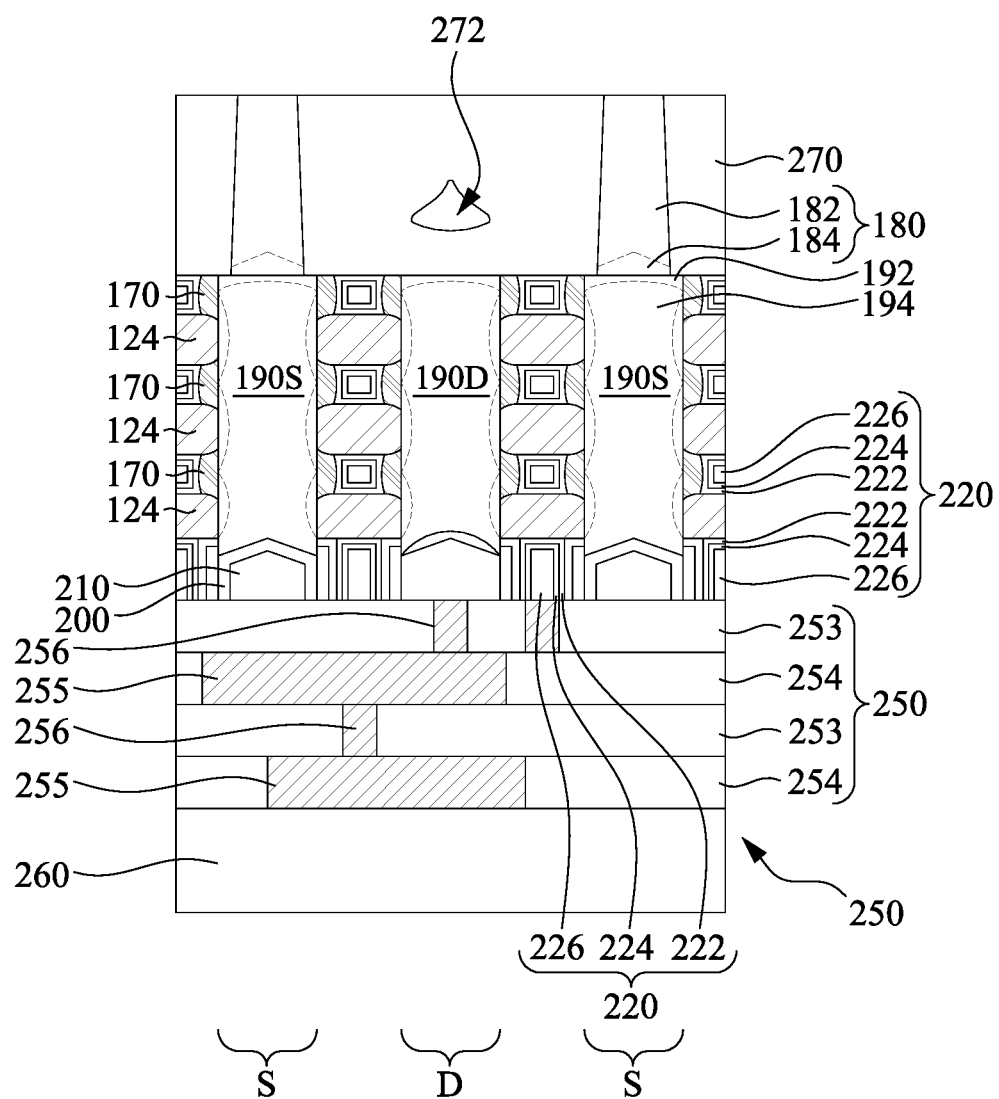

The source-region recesses R3 has a depth T3 that is deep enough to allow air gaps formed in a subsequently formed backside ILD layer, as will be discussed in greater detail below. Stated differently, the deeper the source-region recesses R3, the easier the formation of air gaps in backside ILD layer. As a result, the depth T3 of the source-region recesses R3 is selected to allow for air gap formation in subsequent processing. By way of example, the depth T3 of the source-region recesses R3 is in a range from about 30 nm to about 100 nm. If the depth T3 of the source-region recesses R3 is excessively small, then the air gap (e.g., air gap 272 illustrated in FIG. 21) may not be formed well due to gap height of the subsequently formed gap G4 (as illustrated in FIG. 20) in z-direction is not enough. If the depth T3 of the source-region recesses R3 is excessively large, then the equivalent k value (i.e., dielectric constant) in the subsequently formed backside ILD layer 270 (as illustrated in FIG. 21) may not be as low because the air space in the backside ILD layer 270 is not enough. However, other ranges of the depth T3 of the source-region recesses R3 are within the scope of various embodiments of the present disclosure, as long as air gaps can be formed in the backside ILD layer. Moreover, the shorter the lateral distance D3 between the source-region recesses R3, the easier the formation of air gaps in backside ILD layer. As a result, the lateral distance D3 between the source-region recesses R3 is selected to allow for air gap formation in subsequent processing. By way of example, the lateral distance D3 between the source-region recesses R3 is in a range from about 50 nm to about 100 nm. If the lateral distance D3 between the source-region recesses R3 is excessively small, then the equivalent dielectric constant in the subsequent formed backside ILD layer 270 (as illustrated in FIG. 21) will be not low enough, because the air space may be too small, which results from early merging of deposited dielectric during the deposition of the backside ILD layer 270. If the lateral distance D3 between the source-region recesses R3 is excessively large, then the air gap 272 (as illustrated in FIG. 21) will not be formed well. However, other ranges of the lateral distance D3 between the source-region recesses R3 are within the scope of various embodiments of the present disclosure, as long as air gaps can be formed in the backside ILD layer.

The etching time/duration for forming the source-region recesses R3 is selected to allow the depth T3 of source-region recesses R3 meeting a target value with in the range as discussed above. By way of example and not limitation, the etching time/duration for forming the source-region recesses R3 is in a range from about 30 seconds to about 300 seconds. If the etching time/duration for forming the source-region recesses R3 is excessively short, the depth T3 of the source-region recesses R3 may be insufficient to allow air gap formation in backside ILD layer. If the etching time/ duration for forming the source-region recesses R3 is excessively long, the depth T3 of the source-region recesses R3 may be too deep, such that the equivalent dielectric constant in the subsequently formed backside ILD layer 270 may be not low enough because the air space in the backside ILD layer 270 is not enough.

In some embodiments as illustrated in FIG. 9, the source-region recesses R3 may have sidewalls laterally offset from outermost sidewalls of the inner spacers 170. This is because of shadowing effect resulting from directing etchant ions into the deep recesses R1 between dummy gate structures 150. However, in some other embodiments, sidewalls of the source-region recesses R3 may be aligned with outermost sidewalls of the inner spacers 170.

Figure 10:
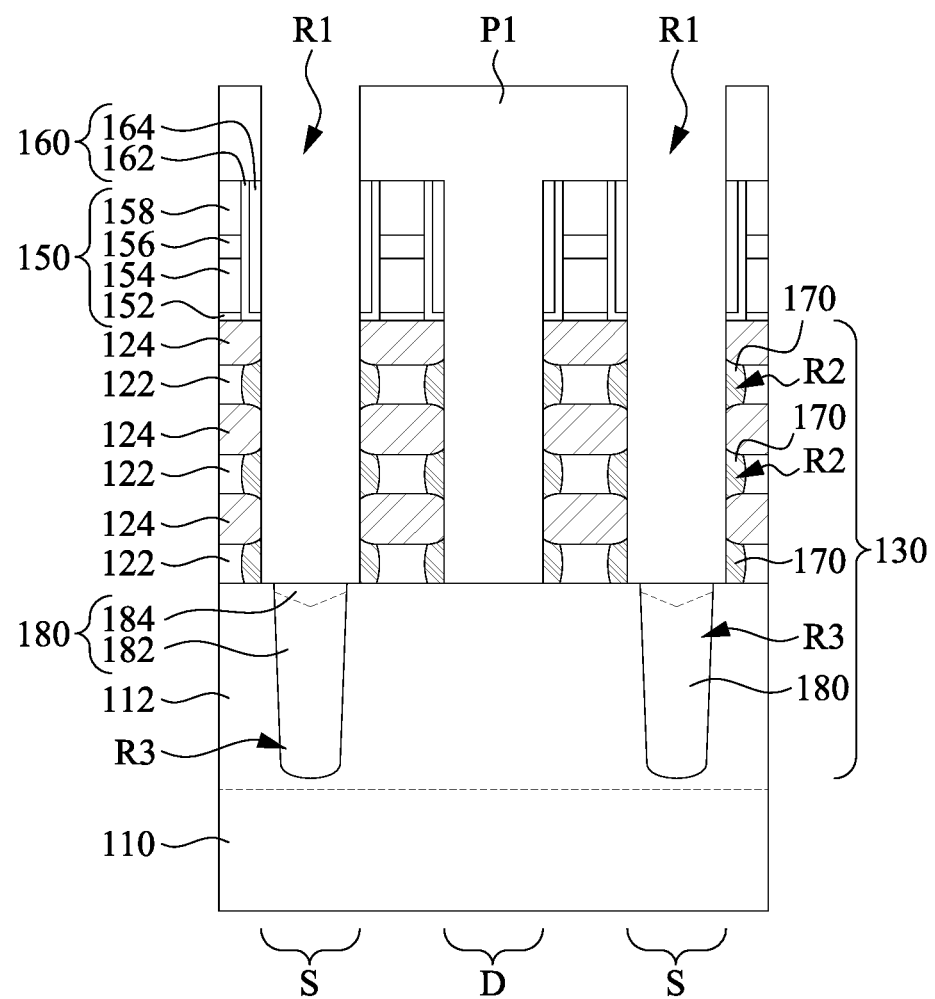

Referring to FIG. 1B, the method M1 then proceeds to step S110 where sacrificial epitaxial plugs are formed in the respective source-region recesses. With reference to FIG. 10, in some embodiments of step S110, with the patterned mask P1 in place, an epitaxial growth process is performed to grow an epitaxial material in the source-region recesses R until the epitaxial material builds up sacrificial epitaxial plugs 180 filling the source-region recesses R3. The epitaxial material has a different composition than the substrate 110, thus resulting in different etch selectivity between the sacrificial epitaxial plugs 180 and the substrate 110. For example, the substrate 110 is Si and the sacrificial epitaxial plugs 180 are SiGe. In some embodiments, the sacrificial epitaxial plugs 180 are SiGe free from p-type dopants (e.g., boron) and n-type dopants (e.g., phosphorous), because the sacrificial epitaxial plugs 180 will be removed in subsequent processing and not serve as source terminals of transistors in a final IC product. In some embodiments, the sacrificial epitaxial plugs 180 each have a first SiGe layer 182 and a second SiGe layer 184 over the first SiGe layer 182. The first and second SiGe layers 182 and 184 are different at least in germanium atomic percentage (Ge %), which in turn allows for different etch selectivity between the first and second SiGe layers 182 and 184. In certain embodiments, the first SiGe layer 182 has a higher germanium atomic percentage than the second SiGe layer 184. By way of example and not limitation, the germanium atomic percentage in the first SiGe layer 182 is in a range from about 20% to about 50%, and the germanium atomic percentage in the second SiGe layer 184 is in a range from about 5% to about 20%. Once formation of the sacrificial epitaxial plugs 180 is complete, the patterned mask P1 is removed by, for example, ashing.

In order to prevent SiGe from being inadvertently formed on end surfaces of the Si channel layers 124, the SiGe plugs 180 can be grown in a bottom-up fashion, in accordance with some embodiments of the present disclosure. By way of example and not limitation, the SiGe plugs 180 can be grown by an epitaxial deposition/partial etch process, which repeats the epitaxial deposition/partial etch process at least once. Such repeated deposition/partial etch process is also called a cyclic deposition-etch (CDE) process. In some embodiments, these SiGe plugs 180 are grown by selective epitaxial growth (SEG), where an etching gas is added to promote the selective growth of silicon germanium from the bottom surface of the source-region recesses R3 that has a first crystal plane, but not from the vertical end surfaces of the channel layers 124 that have a second crystal plane different from the first crystal plane. For example, the SiGe plugs 180 are epitaxially grown using reaction gases such as HCl as an etching gas, $GeH_4$ as a Ge precursor gas, DCS and/or $SiH_4$ as a Si precursor gas, $H_2$ and/or $N_2$ as a carrier gas.

In some embodiments, the etching gas may be other chlorine-containing gases or bromine-containing gases such as $Cl_2$, $BCl_3$, $BiCl_3$, $BiBr_3$ or the like.

SiGe deposition conditions are controlled (e.g., by tuning flow rate ratio among Ge precursor gas, Si precursor gas and carrier gas) in such a way that SiGe growth rate on the bottom surfaces of the source-region recesses R3 is faster than SiGe growth rate on the vertical end surfaces of the channel layers 124, because the bottom surfaces of the source-region recesses R3 and the vertical end surfaces of the channel layers 124 have different crystal orientation planes. Accordingly, the SiGe deposition step incorporating the etching step promotes bottom-up SiGe growth. For example, SiGe is grown from the bottom surface of the source-region recesses R3 at a faster rate than that from the end surfaces of the channel layers 124. The etching gas etches SiGe grown from the end surfaces of the channel layers 124 as well as SiGe grown from the bottom surface of the source-region recesses R3 at comparable etch rates. However, since the SiGe growth rate from the bottom surfaces of the source-region recesses R3 is faster than from the end surfaces of the channel layers 124, the net effect is that SiGe will substantially grow from the bottom surfaces of source-region recesses R3 in the bottom-up fashion. By way of example and not limitation, in each deposition-etch cycle of the CDE process, the etching step stops once the end surfaces of the channel layers 124 are exposed, and the SiGe grown from the bottom surfaces of the source-region recesses R3 remains in the source-region recesses R3 because it is thicker than the SiGe grown from the end surfaces of the channel layers 124. In this way, the bottom-up growth can be realized. The CDE process as discussed above is merely one example to explain how to form SiGe plugs 180 in source-region recesses R3 but absent from end surfaces of Si channel layers 124, and other suitable techniques may also be used to form the SiGe plugs 180.

To achieve different germanium atomic percentages in the first and second SiGe layers 182 and 184, a ratio of a flow rate of the Ge precursor gas (e.g., $GeH_4$) to a flow rate of the Si precursor gas (e.g., $SiH_4$) is varied for their respective growth processes. For example, a Ge-to-Si precursor flow rate ratio during the epitaxial growth of the first SiGe layer 182 is greater than that of the second SiGe layer 184. In this way, the germanium atomic percentage of the first SiGe layer 182 is greater than that of the second SiGe layer 184.

Referring to FIG. 1B, the method M1 then proceeds to step S111 where source epitaxial structures are formed over the sacrificial epitaxial plugs, and drain epitaxial structures are formed over drain regions of the fins. Referring to the example of FIG. 11, in some embodiments of step S111, source epitaxial structures 190S are formed over the respective sacrificial epitaxial plugs 180, and drain epitaxial structures 190D are formed over the drain regions D of the semiconductor fins 130. The source/drain epitaxial structures 190S/190D may be formed by performing an epitaxial growth process that provides an epitaxial material on the sacrificial epitaxial plugs 180 and the fins 130. During the epitaxial growth process, the dummy gate structures 150 and gate sidewall spacers 160 limit the source/drain epitaxial structures 190S/190D to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 130, the sacrificial epitaxial plugs 180 and the channel layers 124.

In some embodiments, the source/drain epitaxial structures 190S/190D may include Ge, Si, GaAs, AlGaAs, SiGe, GaAsP, SiP, or other suitable material. The source/drain epitaxial structures 190S/190D may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 190S/190D are not in-situ doped, an implantation process (i.e., a junction implant process) is performed to dope the source/drain epitaxial structures 190S/190D. In some exemplary embodiments, the source/drain epitaxial structures 190S/190D in an NFET device include SiP, while those in a PFET device include GeSnB and/or SiGeSnB.

In some embodiments, the source/drain epitaxial structures 190S/190D each include a first epitaxial layer 192 and a second epitaxial layer 194 over the first epitaxial layer 192. The first and second epitaxial layers 192 and 194 may be different at least in germanium atomic percentage (Ge %) or phosphorus concentration (P %). In the depicted embodiment, the first epitaxial layer 192 may be not only grown from top surfaces of the sacrificial epitaxial plugs 180 and the fins 130, but also grown from end surfaces of the channel layers 124. This is because formation of the source/drain epitaxial structures 190S/190D does not require the bottom-up approach as discussed previously with respect to sacrificial epitaxial plugs 180.

In some embodiment where the source/drain epitaxial structures 190S/190D include GeSnB and/or SiGeSnB for forming PFETs, the first and second epitaxial layers 192 and 194 are different at least in germanium atomic percentage (Ge %). In certain embodiments, the first SiGe layer 192 has a lower germanium atomic percentage than the second SiGe layer 194. Low germanium atomic percentage in the first SiGe layer 192 helps in reducing Schottky barrier with the un-doped Si in the fins 130. High germanium atomic percentage in the second SiGe layer 194 helps in reducing source/drain contact resistance. By way of example and not limitation, the germanium atomic percentage in the first SiGe layer 192 is in a range from about 5% to about 20%, and the germanium atomic percentage in the second SiGe layer 194 is in a range from about 30% to about 50%. In some embodiments, the second SiGe layer 194 may have a gradient germanium atomic percentage. For example, the germanium atomic percentage in the second SiGe layer 194 increases as a distance from the first SiGe layer 192 increases.

In some embodiments where the source/drain epitaxial structures 190S/190D include SiP for forming NFETs, the first and second SiP layers 192 and 194 are different at least in phosphorous concentration (P %). In certain embodiments, the first SiP layer 192 has a lower phosphorous concentration than the second SiP layer 194. Low phosphorous concentration in the first SiP layer 192 helps in reducing Schottky barrier with the un-doped Si in the fins 130. High phosphorous concentration in the second SiP layer 194 helps in reducing source/drain contact resistance. By way of example and not limitation, the phosphorous concentration in the first SiP layer 192 is in a range from about 10% to about 30%, and the phosphorous concentration in the second SiP layer 194 is in a range from about 20% to about 60%. In some embodiments, the second SiP layer 194 may have a gradient phosphorous concentration. For example, the phosphorous concentration in the second SiP layer 194 increases as a distance from the first SiP layer 192 increases.

Once the source/drain epitaxial structures 190S/190D are formed, an annealing process can be performed to activate the p-type dopants or n-type dopants in the source/drain epitaxial structures 190S/190D. The annealing process may be, for example, a rapid thermal anneal (RTA), a laser anneal, a millisecond thermal annealing (MSA) process or the like.

Figure 12:
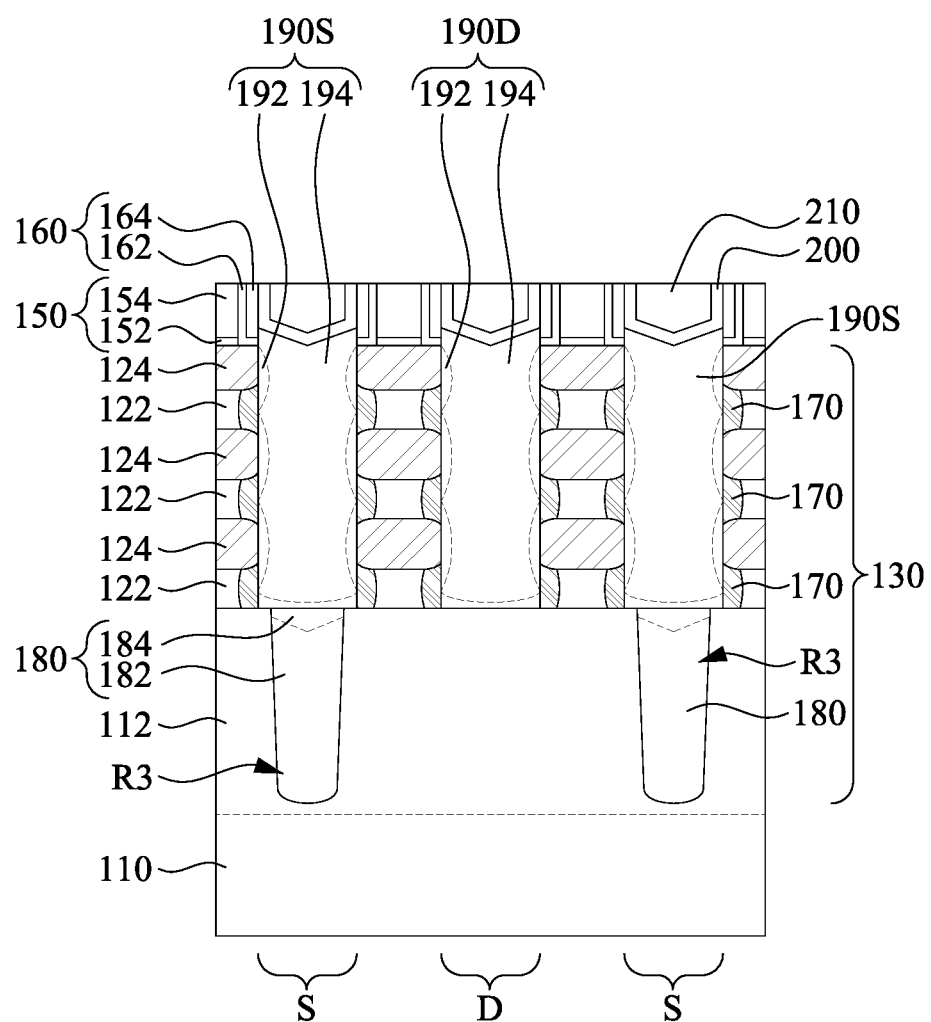
Figure 13:
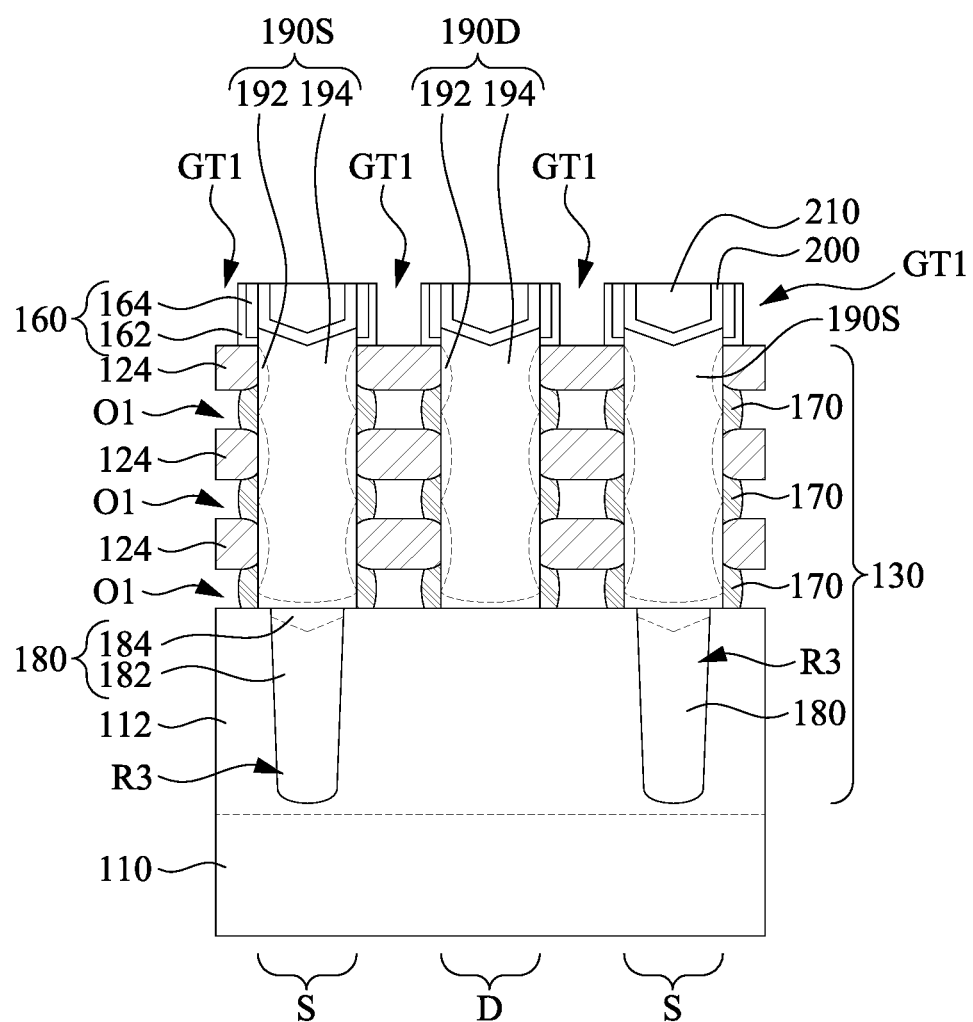

Referring to FIGS. 1B and 12, the method M1 then proceeds to step S112 where a front-side ILD layer 210 is formed on the substrate 110. The ILD layer 210 is referred to a "front-side" ILD layer in this context because it is formed on a front-side of the multi-gate transistors (i.e., a side of the multi-gate transistors that gates protrude from source/drain regions 190S/190D). In some embodiments, a contact etch stop layer (CESL) 200 is also formed prior to forming the ILD layer 210. In some examples, the CESL includes a silicon nitride layer, silicon oxide layer, a silicon oxynitride layer, and/or other suitable materials having a different etch selectivity than the front-side ILD layer 210. The CESL may be formed by plasma-enhanced chemical vapor deposition (PECVD) process and/or other suitable deposition or oxidation processes. In some embodiments, the front-side ILD layer 210 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 200. The front-side ILD layer 210 may be deposited by a PECVD process or other suitable deposition technique. In some embodiments, after formation of the front-side ILD layer 210, the integrated circuit structure 100 may be subject to a high thermal budget process to anneal the front-side ILD layer 210.

Figure 11:
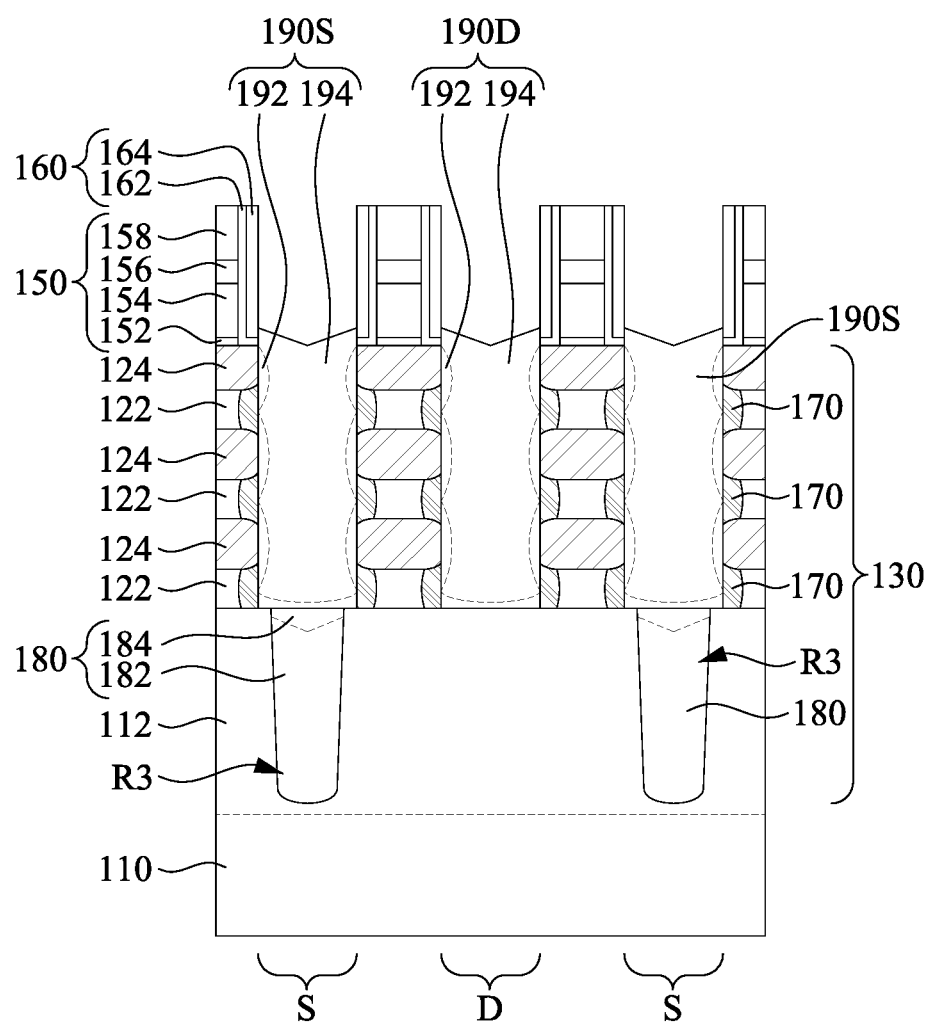

In some examples, after depositing the front-side ILD layer, a planarization process may be performed to remove excessive materials of the front-side ILD layer. For example, a planarization process includes a chemical mechanical planarization (CMP) process which removes portions of the front-side ILD layer 210 (and CESL layer, if present) overlying the dummy gate structures 150 and planarizes a top surface of the integrated circuit structure 100. In some embodiments, the CMP process also removes hard mask layers 156, 158 (as shown in FIG. 11) and exposes the dummy gate electrode layer 154.

Referring to FIG. 1B, the method M1 then proceeds to step S113 where dummy gate structures 150 (as shown in FIG. 12) are removed first, and then the sacrificial layers 122 are removed. The resulting structure is illustrated in FIG. 13. In the illustrated embodiments, step S113 first removes the dummy gate structures 150 by using a selective etching process (e.g., selective dry etching, selective wet etching, or a combination thereof) that etches the materials in dummy gate structures 150 at a faster etch rate than it etches other materials (e.g., gate sidewall spacers 160, CESL 200 and/or front-side ILD layer 210), thus resulting in gate trenches GT1 between corresponding gate sidewall spacers 160, with the sacrificial layers 122 exposed in the gate trenches GT1. Subsequently, step S113 removes the sacrificial layers 122 in the gate trenches GT1 by using another selective etching process that etches the sacrificial layers 122 at a faster etch rate than it etches the channel layers 124, thus forming openings O1 between neighboring channel layers 124. In this way, the channel layers 124 become nanosheets suspended over the substrate 110 and between the source/drain epitaxial structures 190S/190D. This step is also called a channel release process. At this interim processing step, the openings O1 between nanosheets 124 may be filled with ambient environment conditions (e.g., air, nitrogen, etc). In some embodiments, the nanosheets 124 can be interchangeably referred to as nanowires, nanoslabs and nanorings, depending on their geometry. For example, in some other embodiments the channel layers 124 may be trimmed to have a substantial rounded shape (i.e., cylindrical) due to the selective etching process for completely removing the sacrificial layers 122. In that case, the resultant channel layers 124 can be called nanowires.

In some embodiments, the sacrificial layers 122 are removed by using a selective wet etching process. In some embodiments, the sacrificial layers 122 are SiGe and the channel layers 124 are silicon allowing for the selective removal of the sacrificial layers 122. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may not be significantly etched by the channel release process. It can be noted that both the channel release step and the previous step of laterally recessing sacrificial layers (i.e., step S107) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 14A:
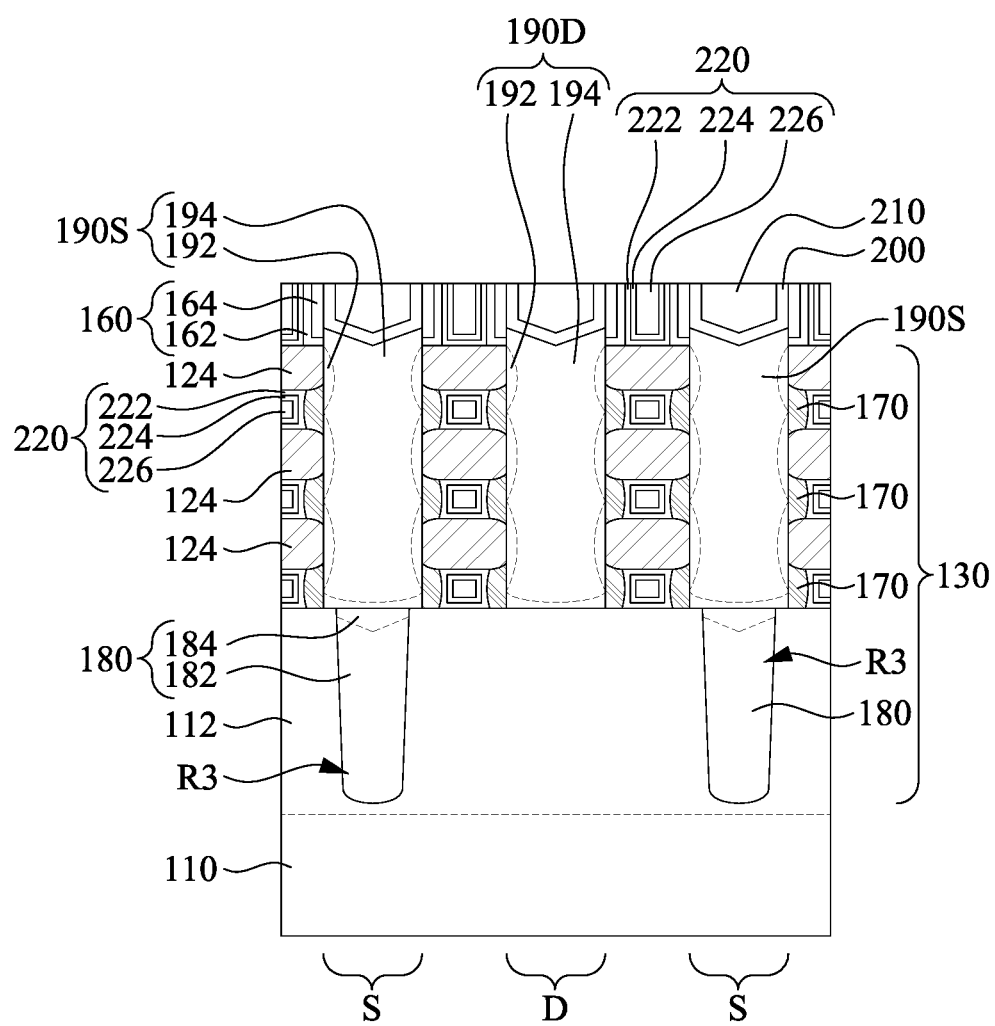
Figure 14B:
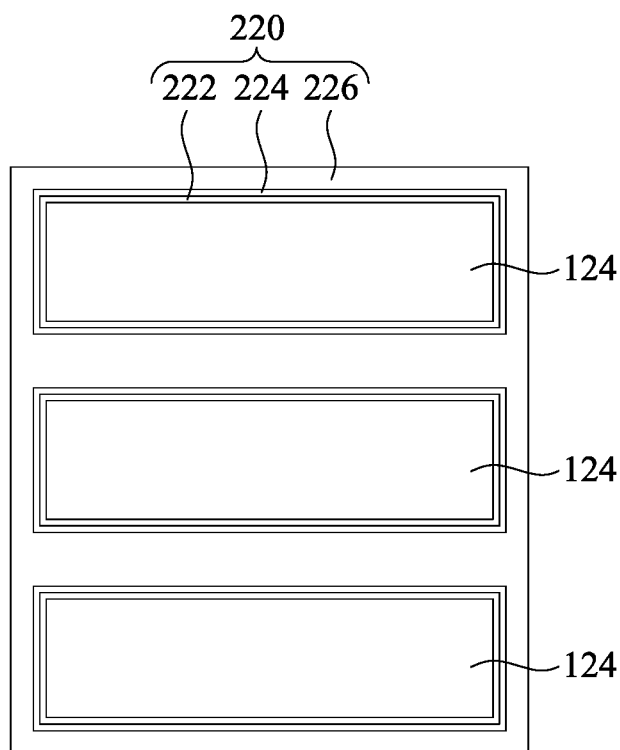
FIG. 14B is a cross-sectional view of some embodiments of the integrated circuit structure at intermediate stages of the method of FIGS. 1A-1C along a second cut.

Referring to FIG. 1B and FIGS. 14A, 14B, the method M1 then proceeds to step S114 where replacement gate structures 220 are respectively formed in the gate trenches GT1 to surround each of the nanosheets 124 suspended in the gate trenches GT1. The gate structure 220 may be the final gate of a GAA FET. The final gate structure may be a high-k/metal gate stack, however other compositions are possible. In some embodiments, each of the gate structures 220 forms the gate associated with the multi-channels provided by the plurality of nanosheets 124. For example, high-k/metal gate structures 220 are formed within the openings O1 (as illustrated in FIG. 13) provided by the release of nanosheets 124. In various embodiments, the high-k/metal gate structure 220 includes a gate dielectric layer 222 formed around the nanosheets 124, a work function metal layer 224 formed around the gate dielectric layer 222, and a fill metal 226 formed around the work function metal layer 224 and filling a remainder of gate trenches GT1. The gate dielectric layer 222 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 224 and/or fill metal layer 226 used within high-k/metal gate structures 220 may include a metal, metal alloy, or metal silicide. Formation of the high-k/metal gate structures 220 may include depositions to form various gate materials, one or more liner layers, and one or more CMP processes to remove excessive gate materials. As illustrated in a cross-sectional view of FIG. 14B that is taken along a longitudinal axis of a high-k/metal gate structure 220, the high-k/metal gate structure 220 surrounds each of the nanosheets 124, and thus is referred to as a gate of a GAA FET.

In some embodiments, the interfacial layer of the gate dielectric layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 222 may include hafnium oxide ($HfO_2$). Alternatively, the gate dielectric layer 222 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 224 may include work function metals to provide a suitable work function for the high-k/metal gate structures 220. For an n-type GAA FET, the work function metal layer 224 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the work function metal layer 224 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 15:
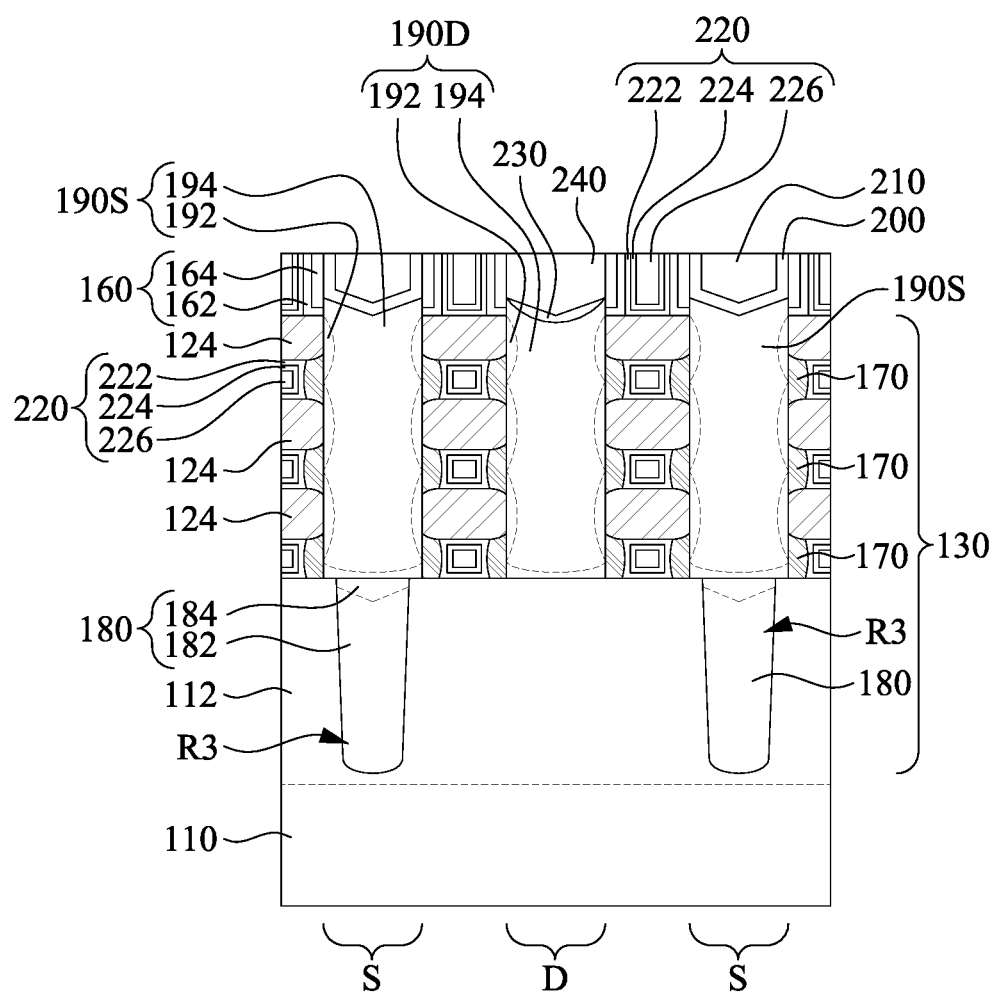

Referring the FIG. 1B, the method M1 then proceeds to step S115 where a drain contact is formed over the drain epitaxial structure. With reference to FIG. 15, in some embodiments, step S115 first forms a drain contact opening through the front-side ILD layer 210 and the CESL 200 to expose the drain epitaxial structure 190D by using suitable photolithography and etching techniques. Subsequently, step S115 forms a drain silicide region 230 on the front side of the drain epitaxial structure 190D by using a silicidation process, followed by forming a drain contact 240 over the drain silicide region 230. Silicidation may be formed by depositing a metal layer (e.g., nickel layer or cobalt layer) over the exposed drain epitaxial structure 190D, annealing the metal layer such that the metal layer reacts with silicon (and germanium if present) in the drain epitaxial structure 190D to form the metal silicide region 230 (e.g., nickel silicide or cobalt silicide), and thereafter removing the non-reacted metal layer. Drain contact 240 may be formed by depositing one or more metal materials (e.g., tungsten, cobalt, copper, the like or combinations thereof) to fill the drain contact hole by using suitable deposition techniques (e.g., CVD, PVD, ALD, the like or combinations thereof), followed by a CMP process to remove excess metal materials outside the drain contact opening.

Figure 16:
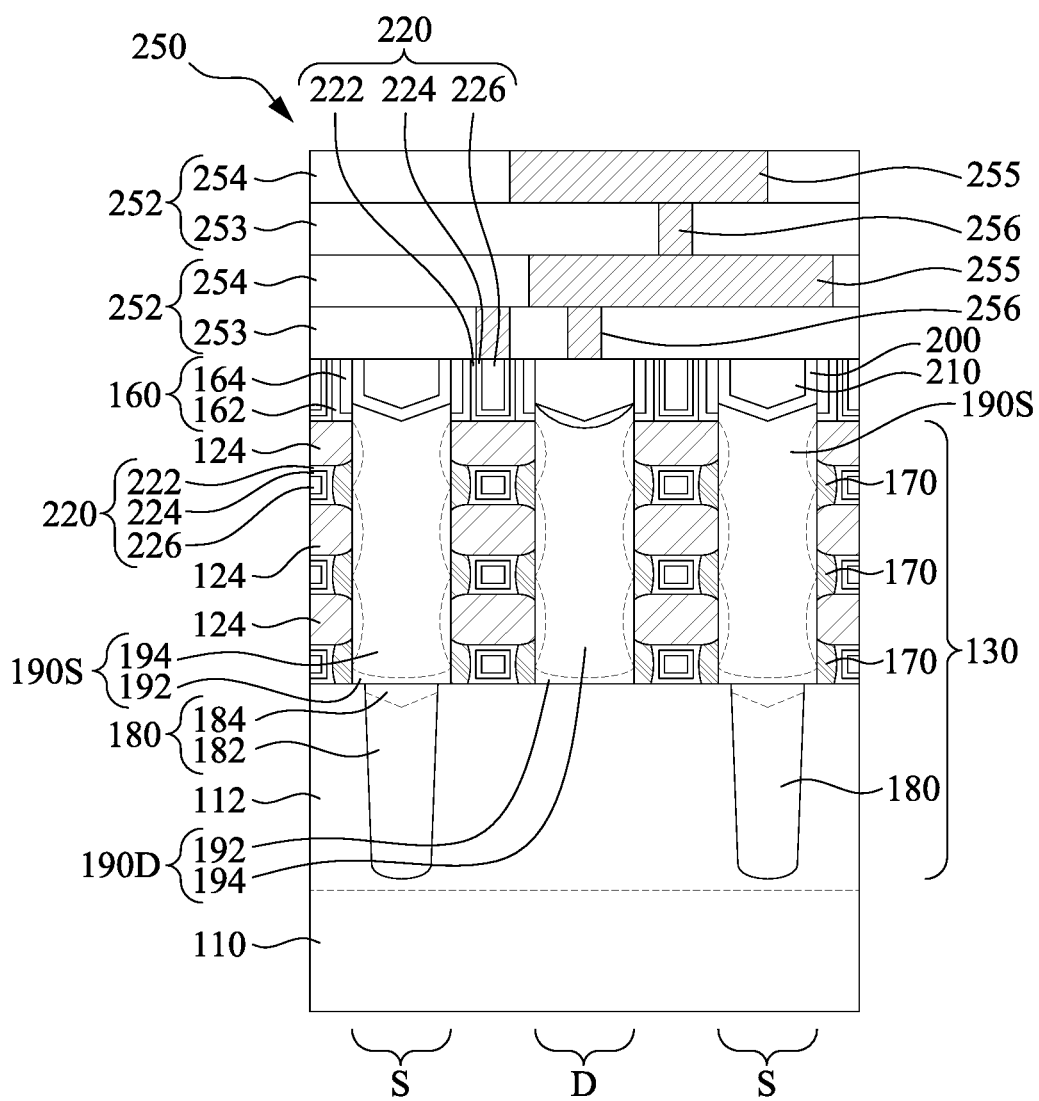

Referring the FIGS. 1B and 16, the method M1 then proceeds to step S116 where a front-side multilayer interconnection (MLI) structure 250 is formed over the substrate 110. The front-side MLI structure 250 may comprises a plurality of front-side metallization layers 252. The number of front-side metallization layers 252 may vary according to design specifications of the integrated circuit structure 100. Only two front-side metallization layers 252 are illustrated in FIG. 16 for the sake of simplicity. The front-side metallization layers 252 each comprise a first front-side inter-metal dielectric (IMD) layer 253 and a second front-side IMD layer 254. The second front-side IMD layers 254 are formed over the corresponding first front-side IMD layers 253. The front-side metallization layers 252 comprise one or more horizontal interconnects, such as front-side metal lines 255, respectively extending horizontally or laterally in the second front-side IMD layers 254 and vertical interconnects, such as front-side conductive vias 256, respectively extending vertically in the first front-side IMD layers 253.

In some embodiments, a front-side conductive via 256 in a bottommost front-side metallization layer 252 is in contact with the gate structure 220 to make electrical connection to the gate structure 220, and a front-side conductive via 256 in the bottommost front-side metallization layer 252 is in contact with the drain contact 240 to make electrical connection to the drain epitaxial structure 190D.

The front-side metal lines 255 and front-side metal vias 256 can be formed using, for example, a single damascene process, a dual damascene process, the like, or combinations thereof. In some embodiments, the front-side IMD layers 253-254 may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 255 and 256 may comprise metal materials such as copper, aluminum, tungsten, combinations thereof, or the like. In some embodiments, the front-side metal lines and vias 255 and 256 may further comprise one or more barrier/adhesion layers (not shown) to protect the respective front-side IMD layers 253-254 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 17:
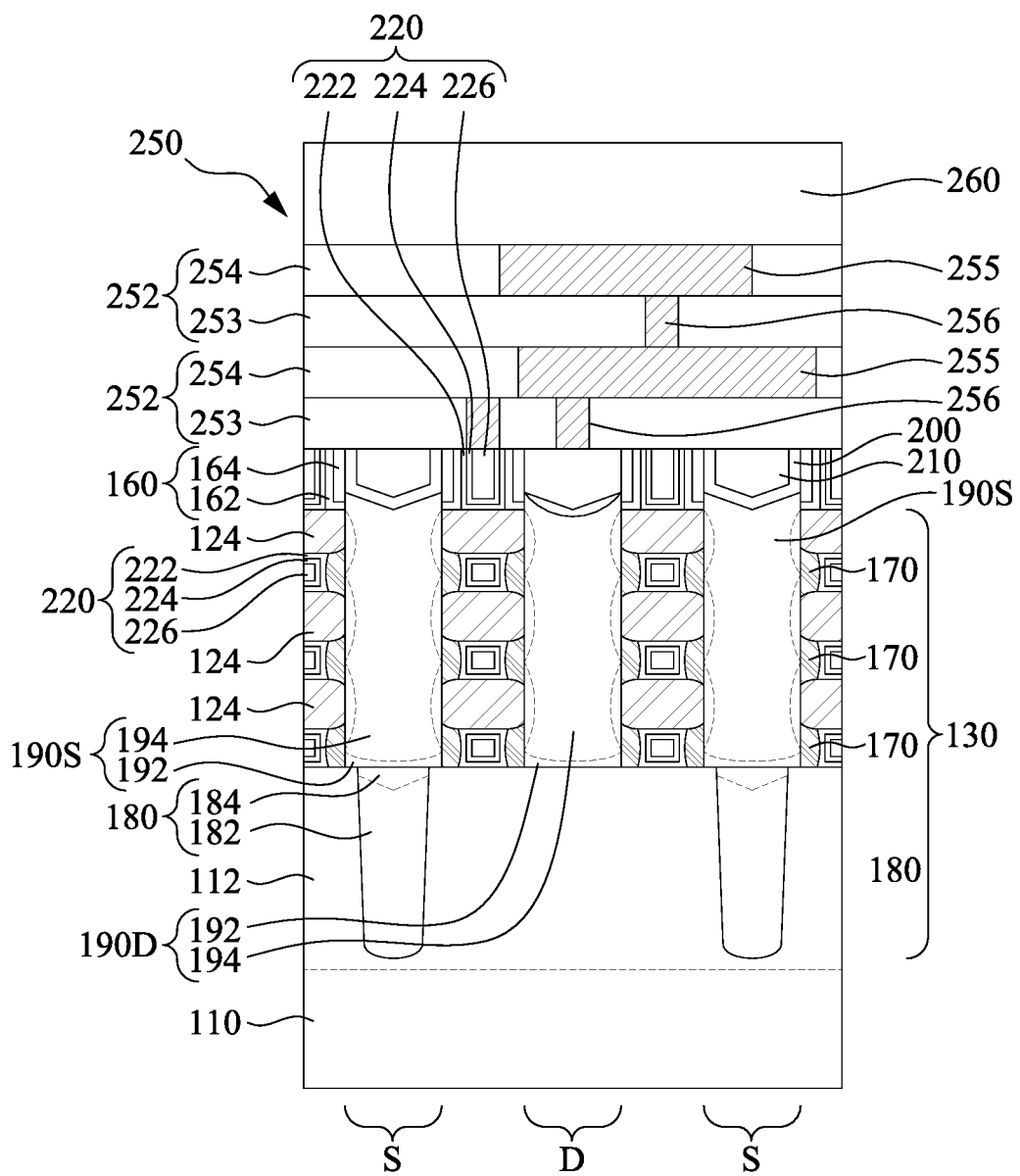
Figure 18:
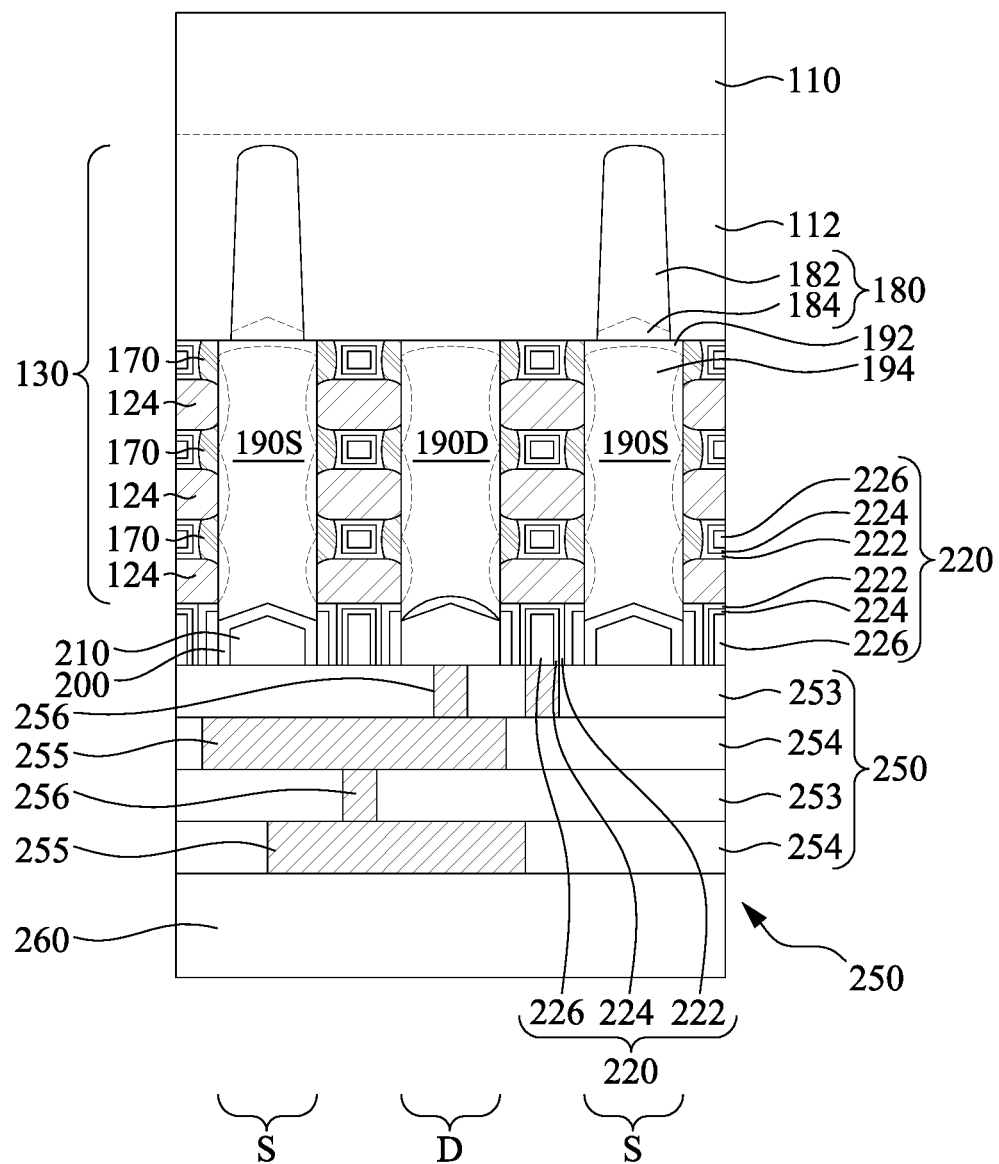

Referring to FIG. 1B and FIG. 17, the method M1 then proceeds to step S117 where a carrier substrate 260 is bonded to the front-side MLI structure 250 in accordance with some embodiments of the present disclosure. The carrier substrate 260 may be silicon, doped or undoped, or may include other semiconductor materials, such as germanium; a compound semiconductor; or combinations thereof. The carrier substrate 260 may provide a structural support during subsequent processing on backside of the integrated circuit structure 100 and may remain in the final product in some embodiments. In some other embodiments, the carrier substrate 260 may be removed after the subsequent processing on backside of integrated circuit structure 100 is complete. In some embodiments, the carrier substrate 260 is bonded to a topmost dielectric layer of the front-side MLI structure 250 by, for example, fusion bonding. Afterwards, the integrated circuit structure 100 is flipped upside down, such that a backside surface of the substrate 110 faces upwards, as illustrated in FIG. 18.

Figure 19:
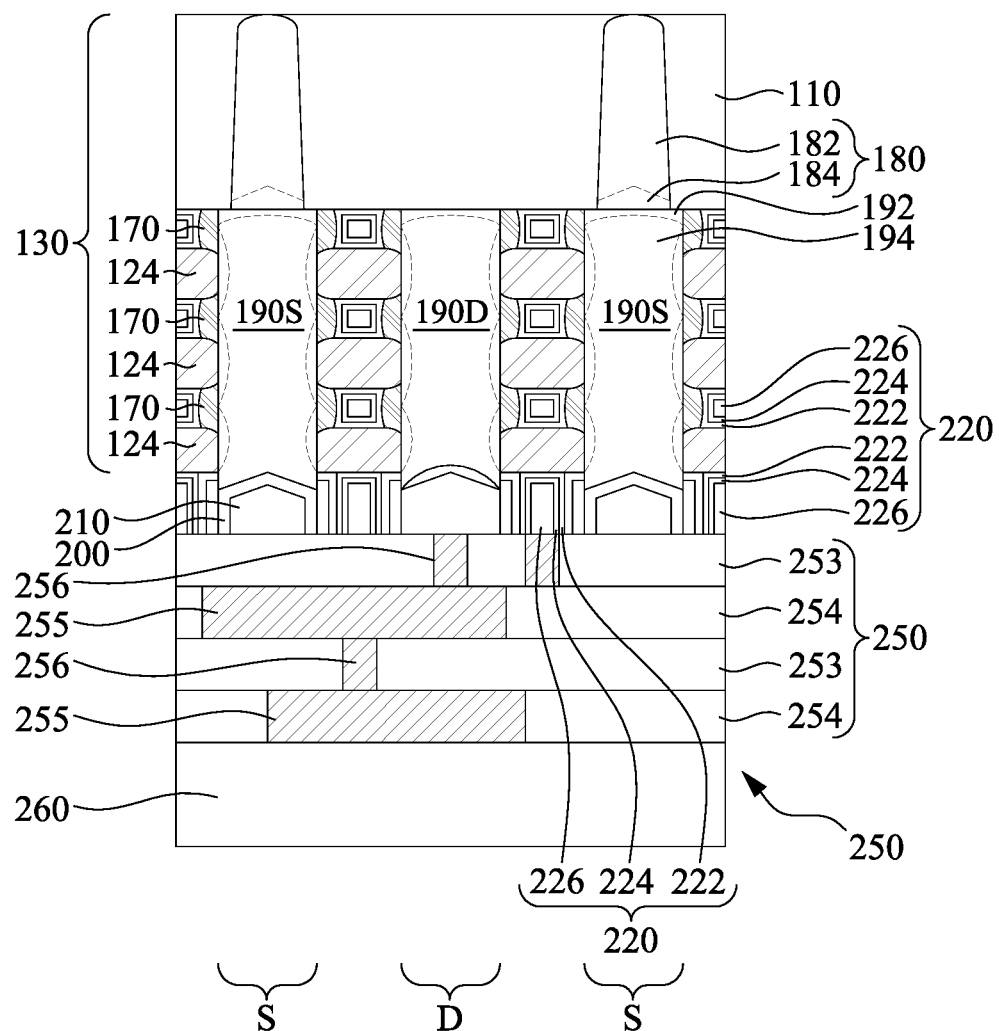

Referring to FIGS. 1B and 19, the method M1 then proceeds to step S118 where the substrate 110 is thinned down to expose the sacrificial epitaxial plugs 180. In some embodiments, thinning is accomplished by a CMP process, a grinding process, or the like.

Referring to FIG. 1B, the method M1 then proceeds to step S119 where the substrate 110 is removed. With reference to FIG. 20, in some embodiments of step S119, the Si substrate 110 is removed by using a selective etching process that etches Si at a faster etch rate that it etches the SiGe plugs 180. In some embodiments, the selective etching process for selectively removing the Si substrate 110 may be a wet etching process using an wet etching solution such as tetramethylammonium hydroxide (TMAH), potassium hydroxide (KOH), $NH_4OH$, the like or combinations thereof.

As a result of the selective etching process, the sacrificial epitaxial plugs 180 protrude from backsides of the source epitaxial structure 190S by a protruding height H4, and are separated from each other by a lateral distance D4. Because the sacrificial epitaxial plugs 180 inherit the geometry of source-region recesses R3 (as illustrated in FIG. 9), the protruding height H4 of the sacrificial epitaxial plugs 180 is substantially the same as the depth T3 of the source-region recesses R3, and the lateral distance D4 between the sacrificial epitaxial plugs 180 is also the same as the lateral distance D3 between the source-region recesses R3. By way of example and not by limitation, the protruding height H4 of the sacrificial epitaxial plugs 180 is in a range from about 30 nm to about 100 nm, and the lateral distance D4 between the sacrificial epitaxial plugs 180 is in a range from about 50 nm to about 100 nm.

Referring to FIG. 1C, the method M1 then proceeds to step S120 where a backside ILD layer with one or more air gaps is formed around the sacrificial epitaxial plugs 180. Reference is made to FIG. 21, in some embodiments, step S120 first deposits a dielectric material of backside ILD layer 270 over the sacrificial epitaxial plugs 180 by using suitable deposition techniques such as a conform deposition technique like CVD. Subsequently, step S120 thins down the deposited dielectric material by using, for example, an etch back process, a CMP process or the like, until the sacrificial epitaxial plugs 180 are exposed from the backside ILD layer 270. The ILD layer 270 is referred to as a "backside" ILD layer in this context because it is formed on a backside of the multi-gate transistors opposite to the front-side of the multi-gate transistors that replacement gates 220 protrude from source/drain regions 190S/190D.

Depositing dielectric material into a narrow gap G4 (as indicated in FIG. 20) between the sacrificial epitaxial plugs 180 results in one or more air gaps 272 (i.e., gaps filled with air) in the resultant backside ILD layer 270 due to the high aspect ratio (i.e., the ratio of gap height (i.e., protruding height H4 of sacrificial epitaxial plugs 180) to gap width (i.e., lateral distance D4 between sacrificial epitaxial plugs)) of the gap G4 between the sacrificial epitaxial plugs 180. In greater detail, the high aspect ratio of the gap G4 between the sacrificial epitaxial plugs 180 may result in overhangs 271 (as illustrated in FIG. 20) formed in an upper portion of the gap G4 between the sacrificial epitaxial plugs 180 during the conformal deposition process. Such overhangs 271 may prevent the backside ILD layer 270 from completely filling the gap G4 between the sacrificial epitaxial plugs 180, so that the air gap 272 is left and sealed in the resultant backside ILD layer 270 as shown in FIG. 21. In some embodiments, the conformal deposition process is plasma-free deposition, such as a thermal CVD process or the like. This is because plasma used in a deposition process (e.g., high-density plasma (HDP) CVD) might result in sputter etch during the deposition, which in turn might inhibit overhangs 271 formed on the upper portion of the gap G4 between the sacrificial epitaxial plugs 180, which in turn might inhibit formation of air gap 272 in the backside ILD layer 270.

In some embodiments as depicted in FIG. 21, the air gap 272 may have a tapered profile with a width decreasing as a distance from the drain epitaxial structure 190D increases. This is because that the formation of overhangs begins from the upper portion of the gap G4 between the sacrificial epitaxial plugs 180. However, it is noted that the shape shown in FIG. 21 is selected purely for demonstration purposes and are not intended to limit the various embodiments of the present disclosure. For example, it is within the scope and spirit of the present disclosure for the air gap 272 to comprise other shapes, such as, but no limited to rectangle, oval, square, trapezoidal, triangle and/or the like. In soma embodiments, the air gap 272 may overlap the drain epitaxial structure 190D because formation of the overhangs begin from upper portions of the sacrificial epitaxial plugs 180 extending from the source epitaxial structures 190S.

In some embodiments, the backside ILD layer 270 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the backside ILD layer 270 has a same material as the front-side ILD layer 210.

Figure 22:
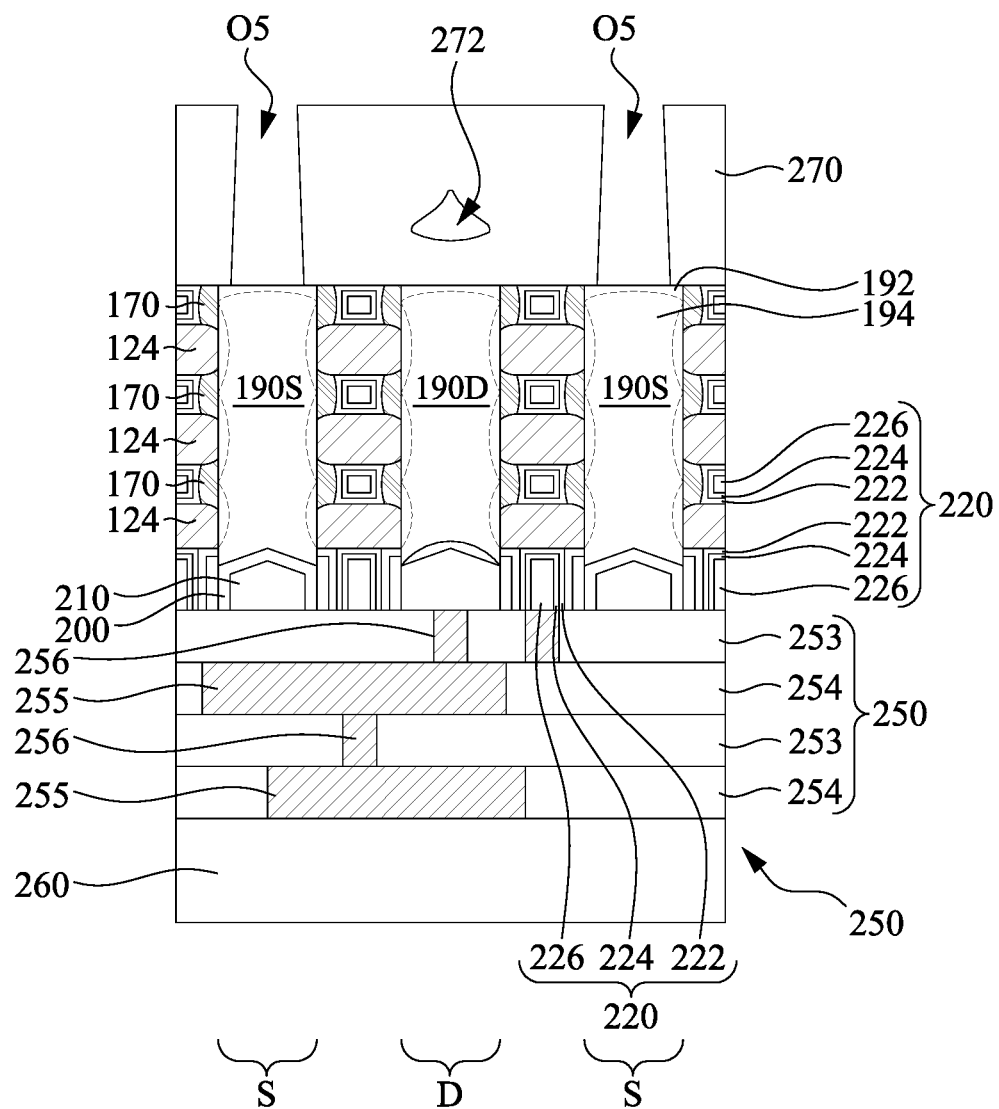

Referring to FIGS. 1C and 22, the method M1 then proceeds to step S121 where the sacrificial epitaxial plugs 180 are removed to form backside via openings O5 extending through the backside ILD layer 270 to expose backsides of the source epitaxial structures 190S. In some embodiments of step S121, the sacrificial epitaxial plugs 180 are removed by using a selective etching process that etches SiGe of the sacrificial epitaxial plugs 180 at a faster etch rate than it etches the dielectric material of the backside ILD layer 270. Stated another way, the selective etching process uses an etchant that attacks SiGe, and hardly attacks the backside ILD layer 270. Therefore, after the selective etching process is complete, the air gap 272 remains sealed in the backside ILD 270. By way of example and not limitation, the sacrificial epitaxial plugs 180 are removed by a selective wet etching such as an APM etch (e.g., ammonia hydroxide-hydrogen peroxide-water mixture) that selectively etches SiGe at a faster etch rate than it etches dielectric materials.

As discussed previously, the second SiGe layer 184 has a lower germanium atomic concentration than the first SiGe layer 182, thus allowing for different etch selectivity between the first and second SiGe layers 182 and 184. As a result, in some embodiments the SiGe selective etching process can etch the second SiGe layer 184 at a slower etch rate than it etching the first SiGe layer 182. Therefore, the second SiGe layer 184 can slow down the SiGe selective etching process and thus acts as a detectable etch end point in the SiGe selective etching process, so as to prevent the source epitaxial structures 190S from being attacked by the SiGe selective etching process. In this way, the source epitaxial structures 190S may remain substantially intact after the SiGe selective etching process in some embodiments of the present disclosure. In some other embodiments, backsides of the source epitaxial structures 190S are recessed due to the SiGe selective etching process. In that case, the first epitaxial layers 192 of the source epitaxial structures 190S at bottoms of the backside via openings O5 may be etched through, such that the second epitaxial layers 194 (which have higher Ge % or P % than the first epitaxial layers 192) may be exposed at the bottoms of the backside via openings O5.

Figure 23:
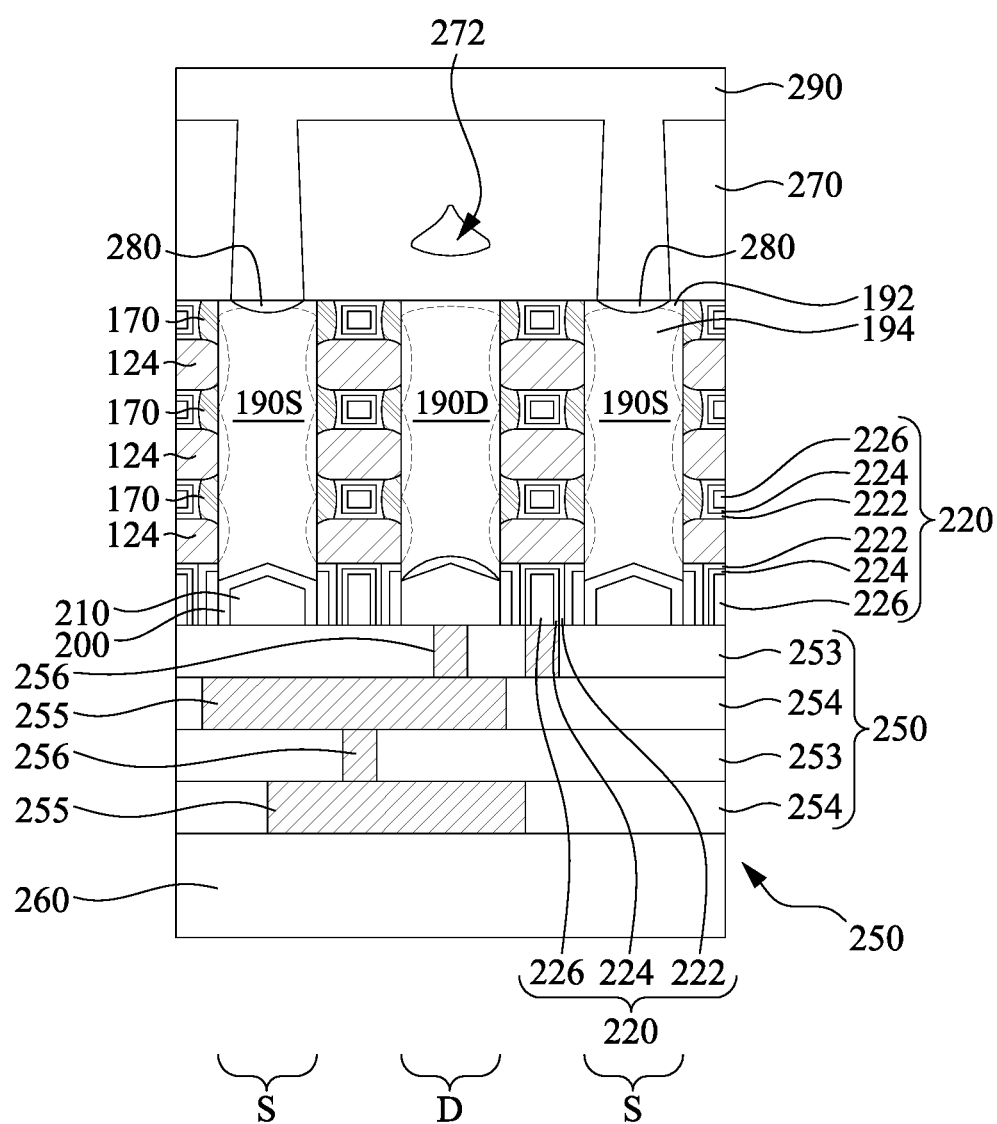

Referring to FIG. 1C, the method M1 then proceeds to step S122 where a metal material layer of backside vias is formed in the backside openings. With reference to FIG. 23, in some embodiments, step S122 first forms a source silicide region 280 on the backside of each of the source epitaxial structures 190S by using a silicidation process, followed by depositing a metal material layer 290 over the source silicide region 280. Silicidation may be performed by depositing a metal layer (e.g., nickel layer or cobalt layer) over the exposed backsides of source epitaxial structures 190S, annealing the metal layer such that the metal layer reacts with silicon (and germanium if present) in the source epitaxial structures 190S to form the metal silicide region 280 (e.g., nickel silicide or cobalt silicide), and thereafter removing the non-reacted metal layer. Once formation of the source silicide regions 280 is complete, one or more metal materials (tungsten, cobalt, copper, the like or combinations thereof) are deposited to form a metal materiel layer 290 overfilling the backside via openings O5 by using suitable deposition techniques (e.g., CVD, PVD, ALD, the like or combinations thereof).

Figure 24:
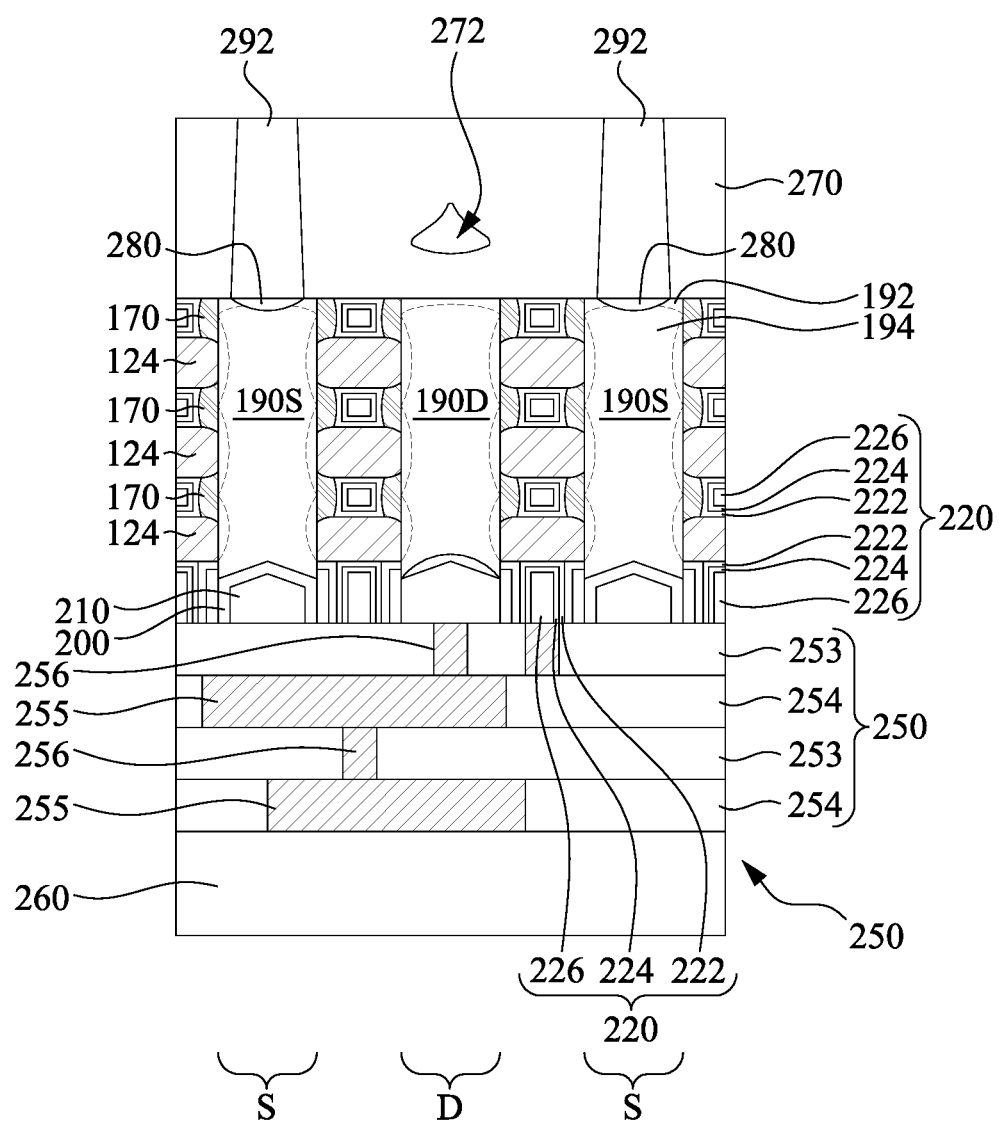

Referring to FIGS. 1C and 24, the method M1 then proceeds to step S123 where the metal material layer 290 is thinned down to form backside vias 292 in the backside via openings O5. In some embodiments of step S123, a CMP process is performed to thin down the metal material layer 290 (as illustrated in FIG. 23) until the backside ILD layer 270 is exposed, while leaving separate portions of the metal material 290 in the backside via openings O5 to serve as backside vias 292. In some embodiments, the CMP process uses high-selectivity slurry (HSS) that has high removal selectivity between the metal material 290 and the dielectric material of backside ILD layer 270 so that determination of polishing end point is made clearer. More particularly, in the CMP process using HSS, the metal material 290 has a faster removal rate (RR) than the dielectric material of the backside ILD layer 270, so that the backside ILD layer 270 can slow down or even stop the CMP process, and thus the backside ILD layer 270 acts as a detectable polishing end point in the CMP process. In this way, the backside ILD layer 270 can remain substantially intact after the CMP process, so that the air gap 272 remains sealed in the backside ILD layer 270. Because air in the sealed air gap 272 exhibits a relative permittivity (or called dielectric constant) approximately equal to 1, the capacitive coupling between adjacent backside vias 292 can be reduced to decrease the RC time delay, which in turn improves operation speed of the integrated circuit 100. In some embodiments, HSS used in this CMP process includes, by way of example and not limitation, aluminum oxide, potassium hydroxide, malonic acid, ferric nitrate, de-ionized water, or combinations thereof.

Figure 25:
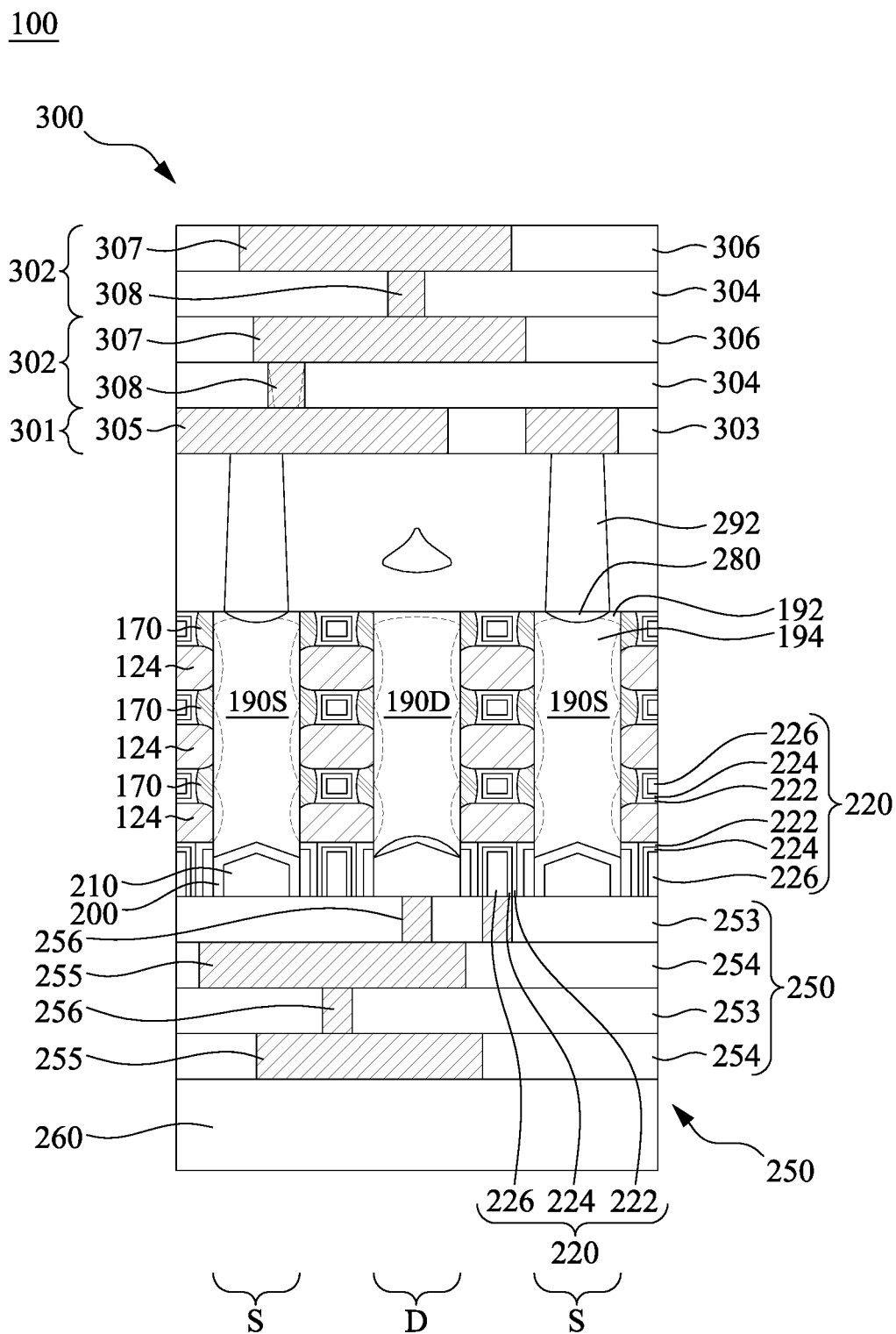

Referring to FIG. 1C and FIG. 25, the method M1 then proceeds to step S124 where a backside MLI structure 300 is formed over the backside vias 292 and the backside ILD layer 270. The backside MLI structure 300 may comprise a bottommost backside metallization layer 301 and a plurality of upper backside metallization layers 302 over the bottommost backside metallization layer 301. The number of upper backside metallization layers 302 may vary according to design specifications of the integrated circuit structure 100.

Only two backside metallization layers 302 (also called backside M1 layer and backside M2 layer) are illustrated in FIG. 25 for the sake of simplicity.

The bottommost backside metallization layer 301 (also called backside M0 layer) comprises a backside IMD layer 303 over the backside ILD layer 270 and one or more horizontal interconnects, such as backside metal lines 305, respectively extending horizontally or lateralling in the backside IMD layer 303. A metal line 305 in the bottommost backside metallization layer 301 is a power rail that extends across and is in contact with one or more source backside vias 292, so as to make electrical connection to one or more source epitaxial structures 190S. Because the power rail is formed in the backside MLI structure 300, more routing space can be provided for the integrated circuit structure 100.

The backside metallization layers (e.g., backside M1 layer and M2 layer) 302 each comprise a first backside inter-metal dielectric (IMD) layer 304 and a second backside IMD layer 306. The second backside IMD layers 306 are formed over the corresponding first backside IMD layers 304. The backside metallization layers 302 comprise one or more horizontal interconnects, such as backside metal lines 307, respectively extending horizontally or laterally in the second backside IMD layers 306 and vertical interconnects, such as backside vias 308, respectively extending vertically in the first backside IMD layers 304.

In some embodiments, the backside vias 308 have tapered profile (as indicated in dash lines) with a width decreasing as a distance from the backside ILD layer 270 decreases, due to the nature of etching via openings in the backside IMD layers 304 after the IC structure 100 is flipped upside down. Moreover, the backside vias 292 have tapered profile with a width decreasing as a distance from the source epitaxial structures 190S increases, due to the nature of etching source-region recesses R3 (as illustrated in FIG. 9) before the IC structure 100 is flipped upside down. Therefore, the backside vias 292 narrow in a direction opposite to a direction in which the backside vias 308 narrow. More specifically, the backside vias 292 narrow in a direction towards the backside MLI structure 300, and the backside vias 308 narrow in a direction towards the front-side MLI structure 250.

FIGS. 26-33 illustrate exemplary cross sectional views of various stages for manufacturing an integrated circuit structure 100' according to some other embodiments of the present disclosure. It is understood that additional operations can be provided before, during, and after processes shown by FIGS. 26-33, and some of the operations described below can be replaced or eliminated, for additional embodiments of the method. The order of the operations/processes may be interchangeable. The same or similar configurations, materials, processes and/or operation as described with FIGS. 2-25 may be employed in the following embodiments, and the detailed explanation may be omitted.

Figure 26:
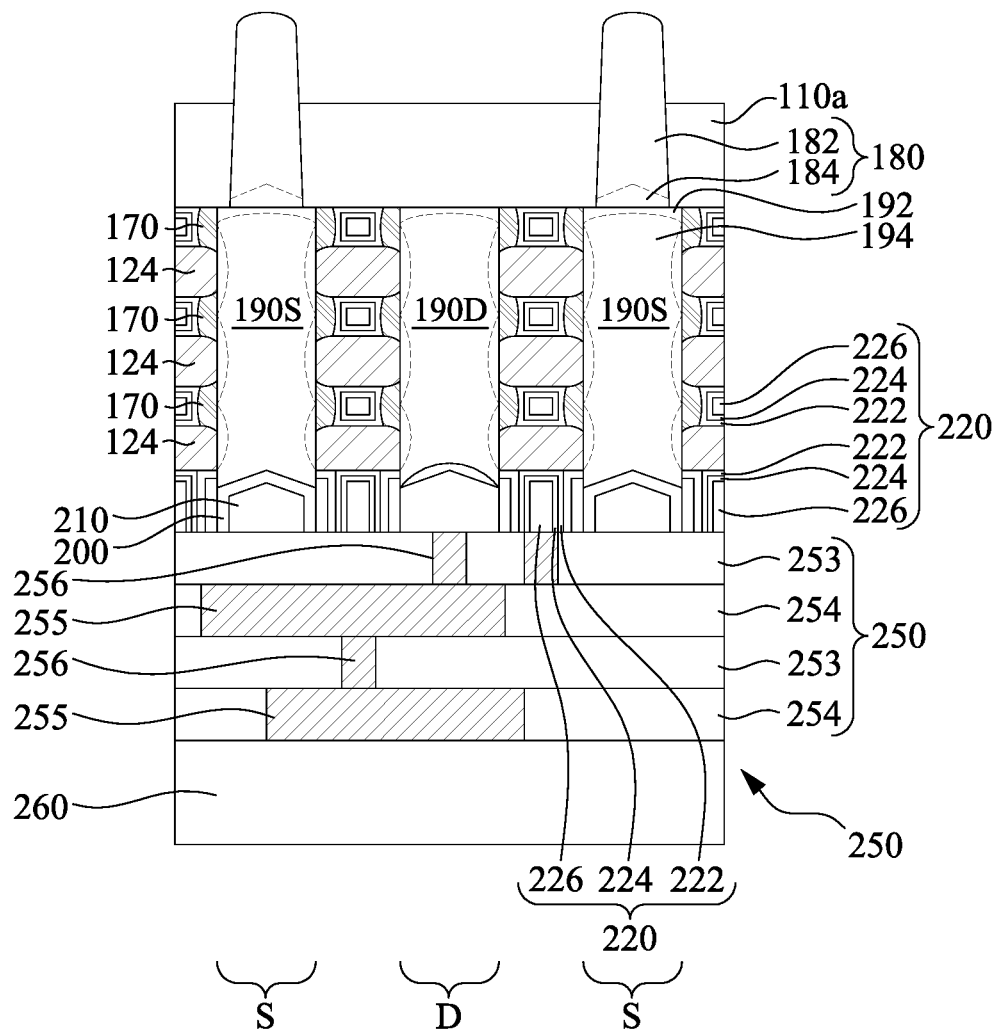
FIGS. 26-33 are cross sectional views of various stages for manufacturing an integrated circuit structure according to some other embodiments of the present disclosure.

After the structure as shown in FIG. 19 is formed, the substrate 110 is etched back such that upper portions of the sacrificial epitaxial plugs 180 protrude from the etched back substrate 110a. The resulting structure is illustrated in FIG. 26. In some embodiments, the Si substrate 110 is etched back by using a selective etching process that etches Si at a faster etch rate that it etches the SiGe plugs 180. In some embodiments, the selective etching process for selectively removing the Si substrate 110 may be a wet etching process using an wet etching solution such as tetramethylammonium hydroxide (TMAH), potassium hydroxide (KOH), NH$_4$OH, the like or combinations thereof. The etching time/duration is controlled such that a lower portion 110a of the Si substrate 110 remains around the sacrificial epitaxial plugs 180 after the etching back is complete.

Figure 27:
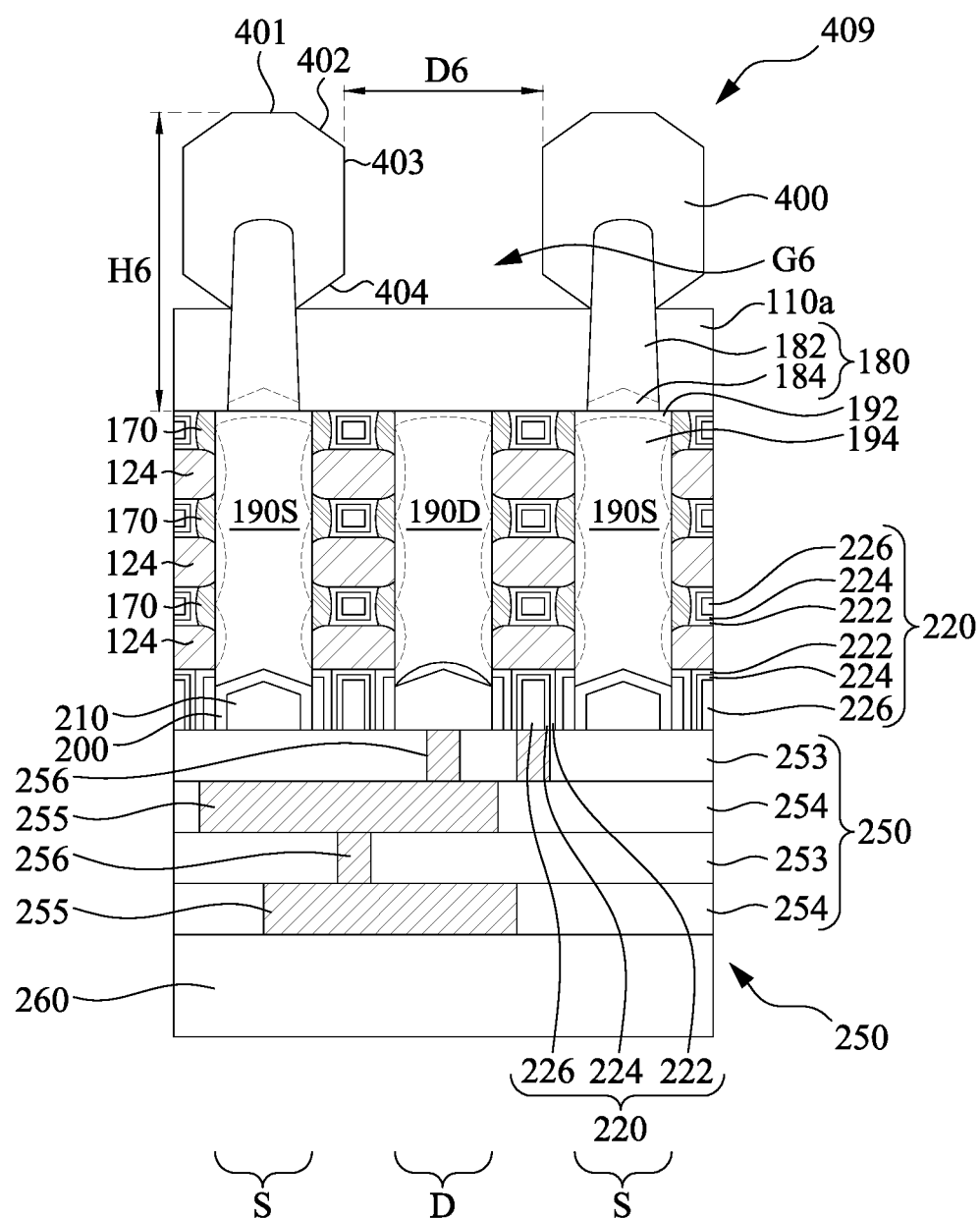

Next, sacrificial epitaxial caps 400 are formed on the protruding portions of the sacrificial epitaxial plugs 180. The resulting structure is illustrated in FIG. 27. In some embodiments, the sacrificial epitaxial caps 400 are SiGe free from p-type dopants (e.g., boron) and n-type dopants (e.g., phosphorous), because the sacrificial epitaxial caps 400 will be removed in subsequent processing and not serve as source terminals of transistors in a final IC product. A combined structure of a sacrificial epitaxial cap 400 and a sacrificial epitaxial plug 180 may be hammer-shaped in a cross-sectional view, and is thus be referred to as a sacrificial hammer-shaped via 409 that will be replaced with a hammer-shaped backside via in subsequent processing. In some embodiments, the sacrificial SiGe caps 400 has a higher germanium atomic concentration than the second SiGe layer 184 of the sacrificial SiGe plugs 180, which in turn allows for etching the SiGe caps 400 at a faster etch rate than etching the second SiGe layer 184 in subsequent backside via opening etching. By way of example and not limitation, the germanium atomic percentage in the sacrificial SiGe caps 400 is in a range from about 20% to about 50%. In some embodiments, the sacrificial SiGe caps 400 have a comparable germanium atomic percentage to that of the first SiGe layer 182 of the sacrificial SiGe plugs 180, because the first SiGe layer 182 does not serve as an etch end point in subsequent backside via opening etching.

Due to different growth rates on different crystal planes of the different surfaces of the sacrificial epitaxial plugs 180, the growth of sacrificial epitaxial caps 400 comprises lateral growth and vertical growth. Facets are hence formed as being the surfaces of sacrificial caps 400. By way of example and not limitation, in the cross-sectional view of FIG. 27, the sacrificial epitaxial caps 400 each have hammer-head profile or an octagonal profile that comprises a horizontal facet 401 at its top, a pair of up-slant facets 402 facing away from the substrate 110a and extending at an angle from opposite sides of the horizontal facet 401, a pair of vertical facets 403 respectively extending from bottom edges of the pair of up-slant facets 402, and a pair of down-slant facets 404 facing the substrate 110a and respectively extending at an angle from bottom edges of the pair of vertical facets 403. The lateral growth of sacrificial epitaxial caps 400 reduces the lateral distance D6 of the gap G6 between the sacrificial hammer-shaped vias 409, and the vertical growth of the sacrificial epitaxial caps 400 increases a height H6 of the sacrificial hammer-shaped via 409. As a result, the sacrificial epitaxial caps 400 can increases the aspect ratio of the gap G6 between the sacrificial hammer-shaped vias 409, which in turn helps in air gap formation in subsequently formed backside ILD layer.

In some embodiments, the sacrificial epitaxial caps 400 can be grown by an epitaxial deposition/partial etch process, which repeats the epitaxial deposition/partial etch process at least once. Such repeated deposition/partial etch process is also called a cyclic deposition-etch (CDE) process that includes one or more repetitions of a deposition step and an etch step. For example, the CDE process may perform a deposition step followed by an etch step, and then repeats the deposition and cleaning steps. In some exemplary embodiments where the sacrificial epitaxial caps 400 are SiGe, the SiGe caps 400 can be epitaxially grown using reaction gases such as HCl as an etching gas, GeH$_4$ as a Ge precursor gas, DCS and/or SiH$_4$ as a Si precursor gas, H$_2$ and/or N$_2$ as a carrier gas. In some embodiments, the etching gas may be other chlorine-containing gases or bromine-containing gases such as $Cl_2$, $BCl_3$, $BiCl_3$, $BiBr_3$ or the like.

SiGe deposition conditions can be controlled (e.g., by tuning flow rate ratio among Ge precursor gas, Si precursor gas and carrier gas) in such a way that SiGe growth rate on surfaces of the SiGe plugs 180 is faster than SiGe growth rate on the backside surface of the etched back Si substrate 110a, because the surfaces of the SiGe plugs 180 have different crystal orientation planes than the backside surface of the etched back Si substrate 110a. Moreover, the etching gas etches SiGe grown from the etched back Si substrate 110a at an etch rate comparable to it etches SiGe grown from the SiGe plugs 180. The net effect of the CDE process is that SiGe caps 400 will selectively grow from the SiGe plugs 180, while leaving the backside surface of the Si substrate 110a exposed. By way of example and not limitation, in each deposition-etch cycle of the CDE process, the etching step stops once the backside surface of the Si substrate 110a is exposed, while the SiGe grown from the SiGe plugs 180 remains on the SiGe plugs 180 because it is thicker than the SiGe grown from the backside surface of the Si substrate 110a.

The CDE process as discussed above is merely one example to explain how to form SiGe caps 400 on the SiGe plugs 180 but absent from the backside surface of the Si substrate 110a, and other suitable techniques may also be used to form the SiGe caps 400. For example, in some other embodiments, a patterned mask (e.g., oxide mask) may be formed over the backside surface of the Si substrate 110a prior to forming the SiGe caps 400, so that the patterned mask can prevent SiGe growth on the backside surface of the Si substrate 110a. The patterned mask may be formed by, for example, depositing a dielectric material over the backside surface of the Si substrate 110a and also over the SiGe plugs 180, followed by etching back the dielectric material such that upper portions of the SiGe plugs 180 protrude above the etched back dielectric material. With the patterned mask in place, the SiGe caps 400 can be formed on the SiGe plugs 180 by using MOCVD, MBE, and/or other suitable epitaxial growth processes. The patterned mask is then removed from the backside surface of the Si substrate 110a after forming the SiGe caps 400, leaving a gap between bottommost ends of the SiGe caps 400 and the backside surface of the Si substrate 110a. In that case, the SiGe caps 400 are entirely separated from the Si substrate 110a due to the gap left by the pattern mask removal.

Figure 28:
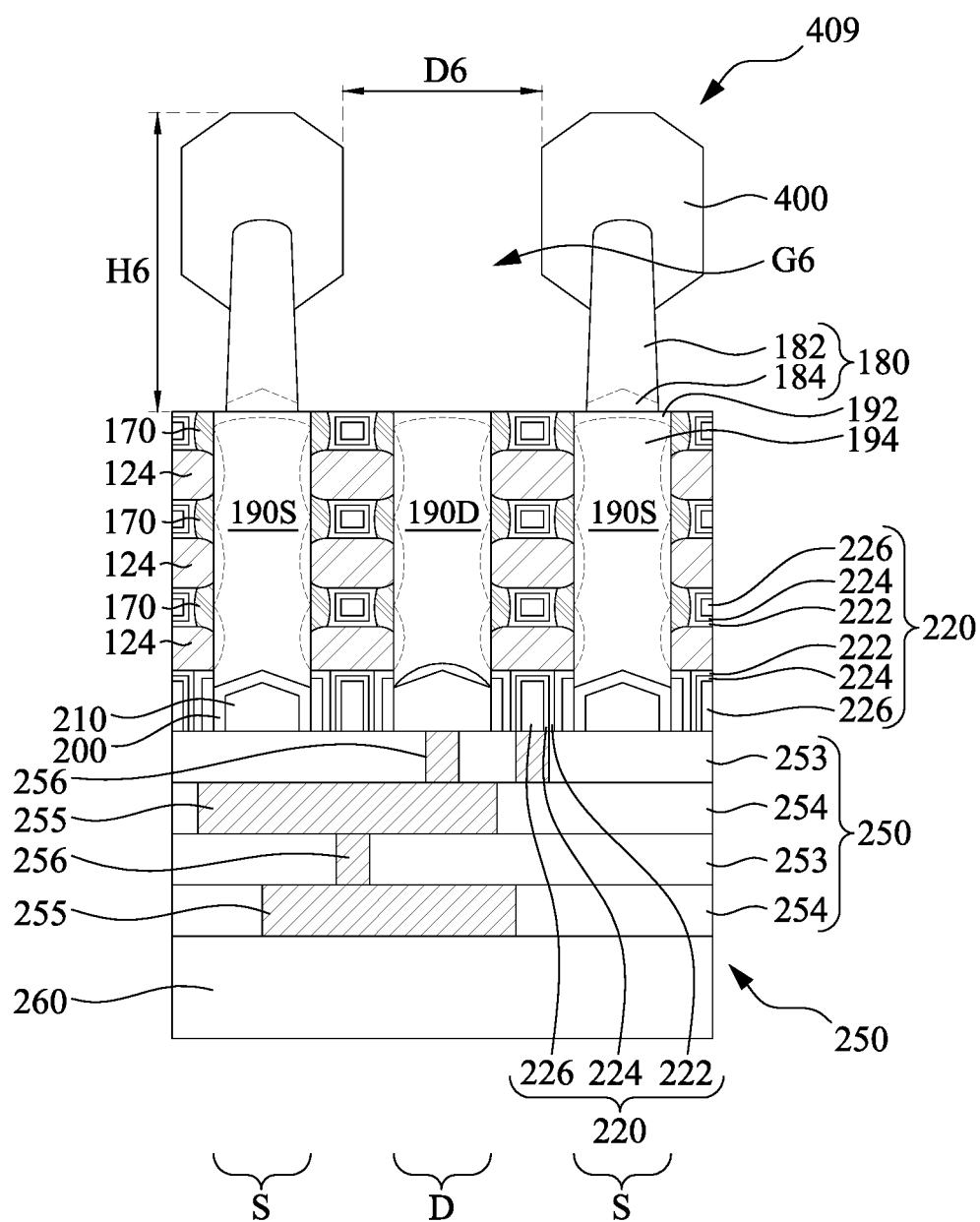

After formation of the sacrificial epitaxial caps 400 is complete, the substrate 110 is removed by using a selective etching process, thus leaving a gap G6 with high aspect ratio between the sacrificial hammer-shaped vias 409. The resulting structure is illustrated in FIG. 28. For example, in some embodiments where the substrate 110 is Si and the sacrificial hammer-shaped vias 409 are SiGe, the Si substrate 110 is removed by using a selective etching process that etches Si at a faster etch rate than it etches the SiGe via structures 409. In some embodiments, the selective etching process for selectively removing the Si substrate 110 may be a wet etching process using an wet etching solution such as tetramethylammonium hydroxide (TMAH), potassium hydroxide (KOH), $NH_4OH$, the like or combinations thereof.

As a result of the selective etching process, the sacrificial hammer-shaped vias 409 protrude from backsides of the source epitaxial structure 190S by a protruding height H6, and are separated from each other by a lateral distance D6. By way of example and not limitation, the protruding height H6 of the sacrificial hammer-shaped vias 409 is in a range from about 40 nm to about 150 nm, and the lateral distance D6 between the sacrificial hammer-shaped vias 409 is in a range from about 20 nm to about 80 nm.

Figure 29:
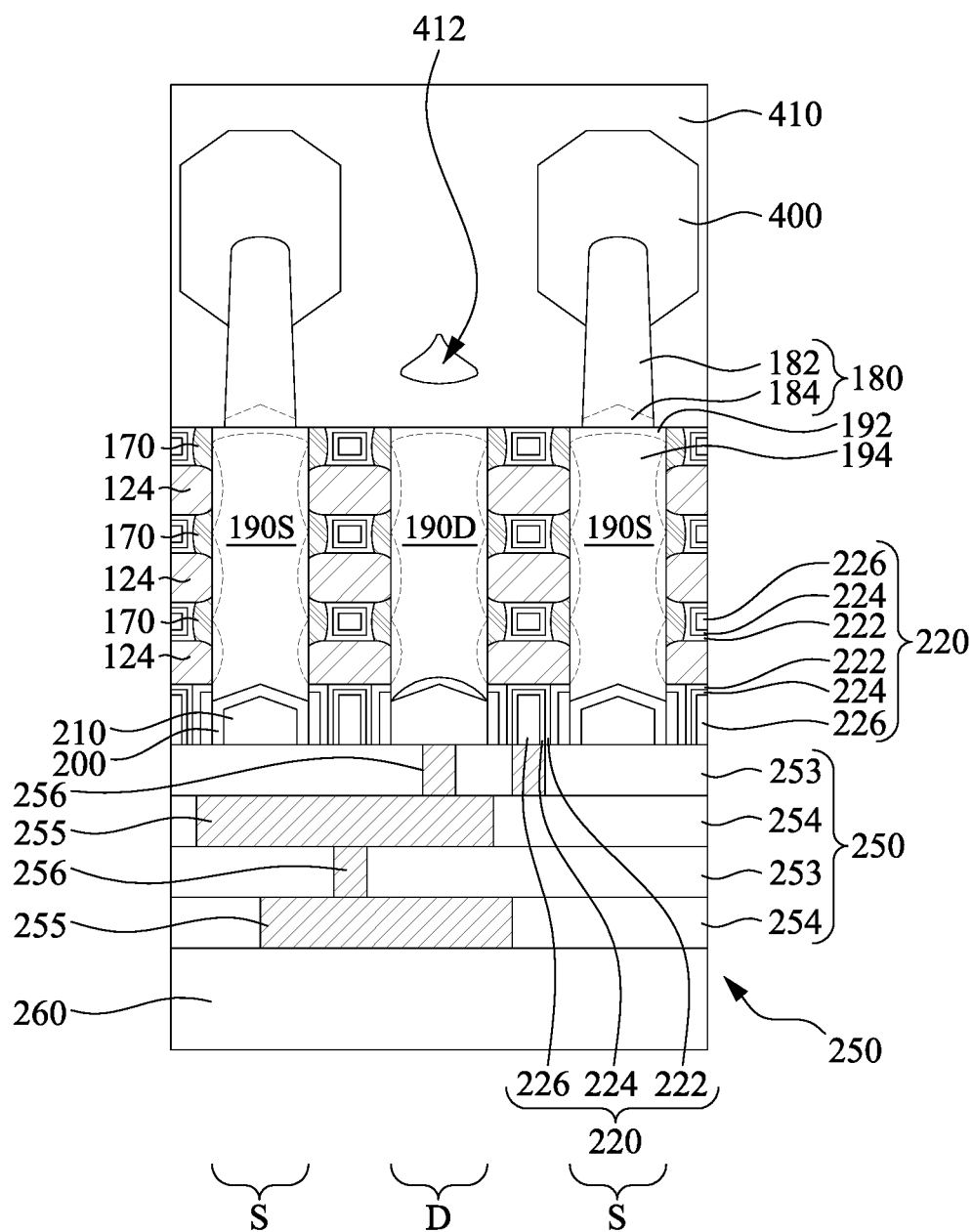
Figure 30:
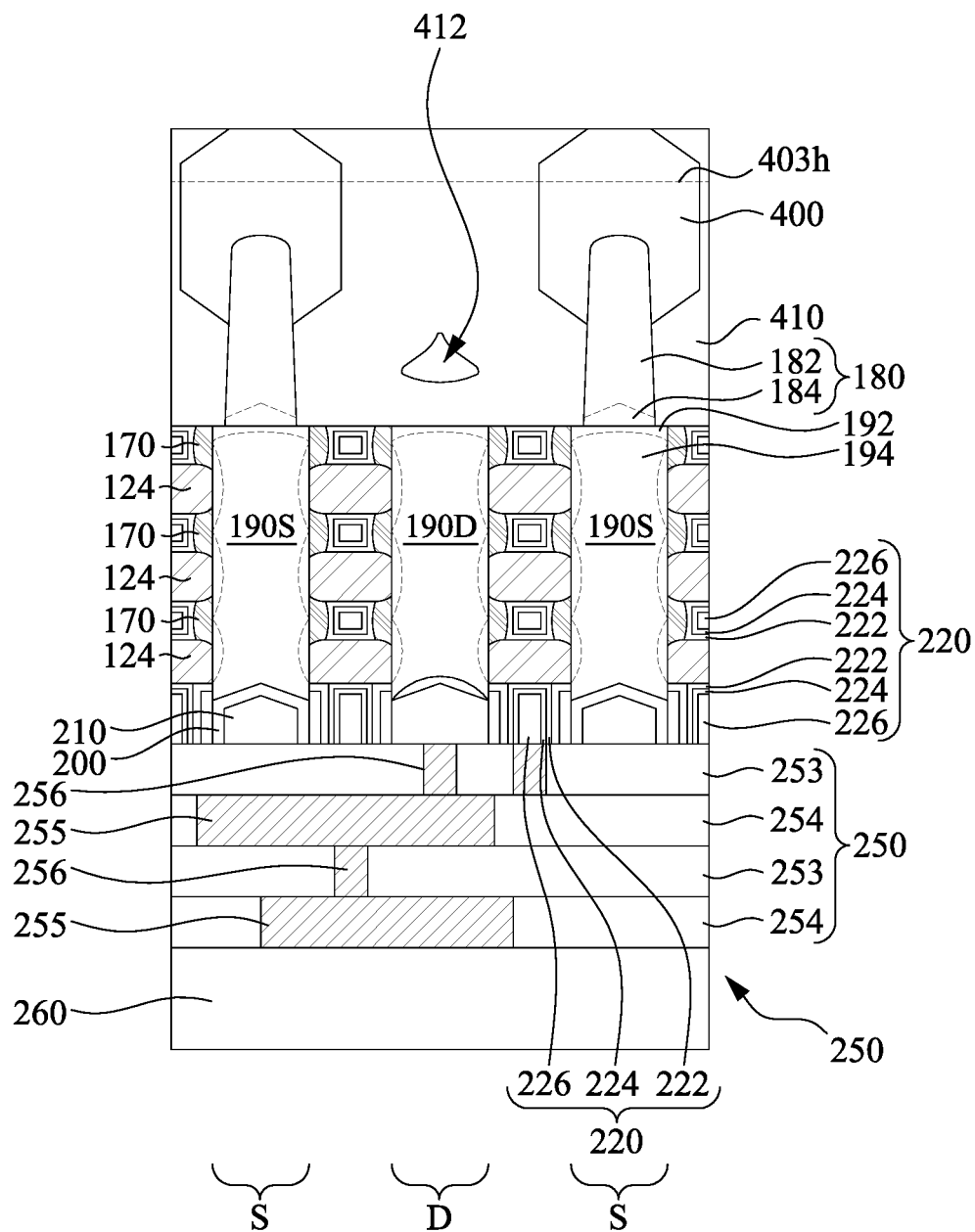

Next, as illustrated in FIG. 29, a backside ILD layer 410 is formed over the sacrificial hammer-shaped vias 409, the source/drain epitaxial structures 190S/190D, the replacement gate structures 220 and the inner spacers 170 by using suitable deposition techniques such as a conform deposition technique like CVD. Depositing dielectric material into a narrow gap G6 (as indicated in FIG. 28) between the sacrificial hammer-shaped vias 409 results in one or more air gaps 412 (i.e., gaps filled with air) in the resultant backside ILD layer 410 due to the high aspect ratio (i.e., the ratio of gap height (i.e., protruding height H6 of sacrificial hammer-shaped vias 409) to gap width (i.e., lateral distance D6 between the sacrificial hammer-shaped vias 409)) of the gap G6 between the sacrificial hammer-shaped vias 409. In greater detail, the gap G6 with high aspect ratio may result in overhangs formed in an upper portion of the G6 between the sacrificial hammer-shaped vias 409 during the conformal deposition process, which in turn prevents the dielectric material 410 from completely filling the gap G6 between the sacrificial hammer-shaped vias 409, thus leaving one or more air gaps 412 in the resultant backside ILD layer 410.

In some embodiments, the conformal deposition process for forming the backside ILD layer 410 is plasma-free deposition, such as thermal CVD or the like, which may help in overhang formation and hence air gap formation. In the depicted embodiment, the air gap 412 may have a width decreasing as a distance from the drain epitaxial structure 190D increases. However, it is noted that the shape shown in FIG. 29 is selected purely for demonstration purposes and are not intended to limit the various embodiments of the present disclosure. For example, it is within the scope and spirit of the present disclosure for the air gap 412 to comprise other shapes, such as, but no limited to rectangle, oval, square, trapezoidal, triangle and/or the like. In soma embodiments, the air gap 412 may overlap the drain epitaxial structure 190D.

In some embodiments, the backside ILD layer 410 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the backside ILD layer 410 has a same material as the front-side ILD layer 210.

Once deposition of the backside ILD layer 410 is complete, the backside ILD layer 410 is thinned down until the sacrificial hammer-shaped vias 409 become exposed. The thinning can be accomplished by an etch back process, a CMP process or the like. Take etch back process for example, because the sacrificial hammer-shaped vias 409 are formed of SiGe, which is different from the dielectric material of the backside ILD layer 410, the etchant used in the etch back process can be selected in such a way that the sacrificial hammer-shaped vias 409 have a slower etch rate than the backside ILD layer 410. In this way, the hammer-shaped vias 409 can act as a detectable etching end point, which in turn prevents over-etching the backside ILD layer 410, so that the air gap 412 remains sealed in the backside ILD layer 410 after the etch back process is complete.

In the depicted embodiment, the etch back process stops at a level height of the top horizontal facet 401 of the sacrificial epitaxial caps 400 in order to lower risk that the air gap 412 might get exposed due to over-etching. However, in some other embodiments, the etch back time/ duration may be fine-tuned to stop at a slightly lower level height, such as at the level height 403*h* between topmost and bottommost positions of the vertical facet 403, so that the upper portions of the sacrificial epitaxial caps 400 may protrude from the backside ILD layer 410, while the air gap 412 remains sealed after the etch back process is complete.

Figure 31:
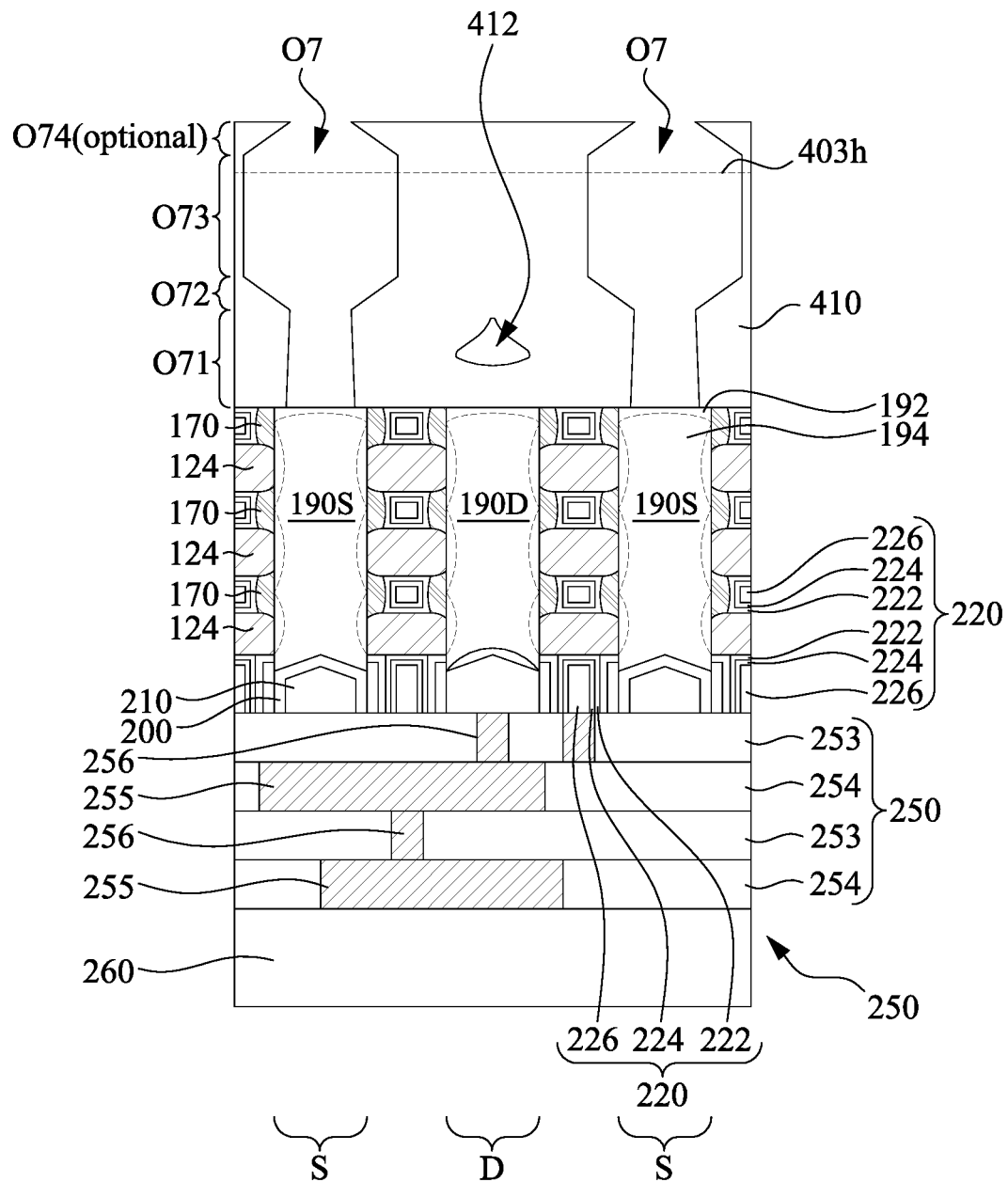

Next, the exposed sacrificial hammer-shaped vias 409 are removed to form backside via openings O7 extending through the backside ILD layer 410 to expose backsides of the source epitaxial structures 190S. The resulting structure is illustrated in FIG. 31. The backside via openings O7 may be hammer-shaped in a cross-sectional view, because they inherit geometry of the sacrificial hammer-shaped vias 409. In greater detail, the backside via openings O7 each have a first portion O71 having a tapered profile with a width decreasing as a distance from the source epitaxial structure 190S increases; a second portion O72 over the first portion O71 and having a tapered profile with a width decreasing as a distance from the source epitaxial structure 190S decreases; a third portion O73 over the second portion O72 and having vertical sidewalls and a width keeping uniform as a distance from the source epitaxial structure 190S increases; and a fourth portion O74 over the third portion O73 and having a tapered profile with a width decreasing as a distance from the source epitaxial structure 190S increases.

In some embodiments where the previous etch back process performed on the backside ILD layer 410 stops at the level height 403*h* between topmost and bottommost positions of the vertical facet 403, the backside via openings O7 are free from the fourth tapered portions O74. In that scenario, the top portions of the backside via openings O7 are the third portions O73 having vertical sidewalls and the largest widths, which in turn increases contact area for subsequently formed backside vias, thus reducing contact resistance and further reducing RC time delay.

Figure 32:
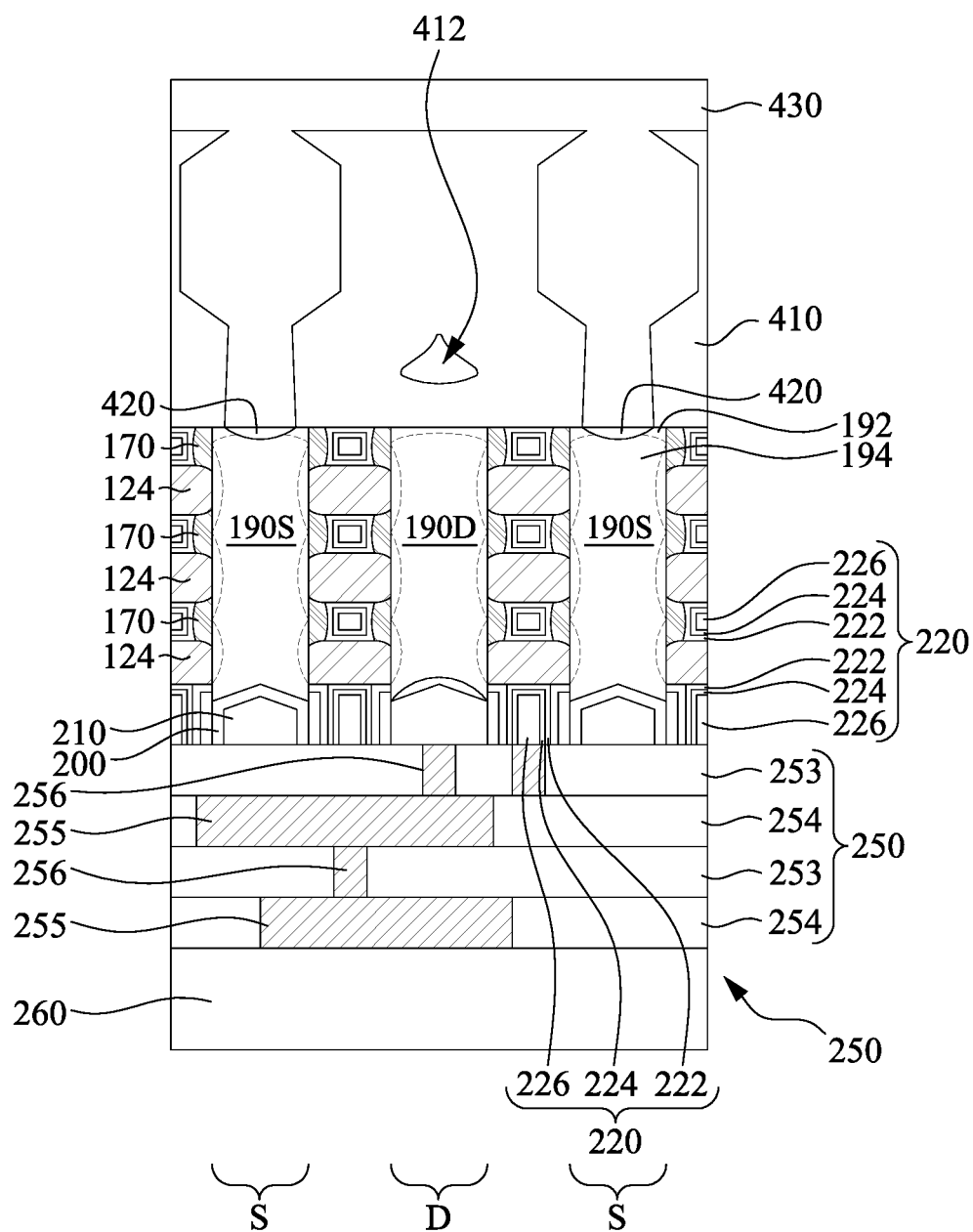

Next, as illustrated in FIG. 32, source silicide regions 420 are respectively formed on backsides of the source epitaxial structures 190S by using a silicidation process, and then a metal material layer 430 is deposited over the source silicide region 420. Formation methods and materials of the source silicide regions 420 and metal material layer 430 are discussed previously with respect to the silicide regions 280 and the metal material layer as illustrated in FIG. 23, and thus they are not repeated herein for the sake of brevity.

Figure 33:
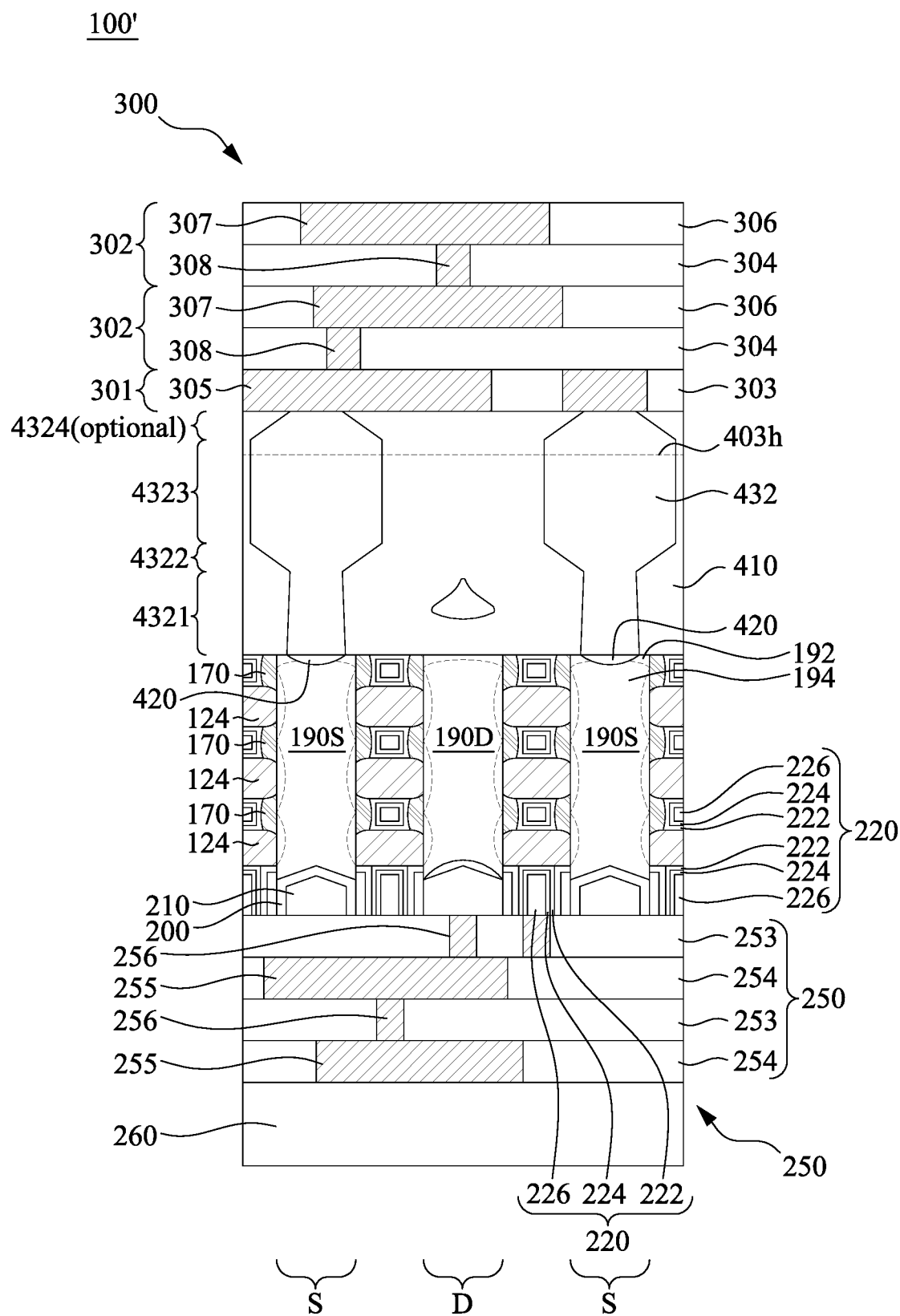

The metal material layer 430 is then thinned down by using, e.g., CMP, until the backside ILD layer 410 is exposed. After the CMP process is complete, portions of the metal material layer 430 remain in the respective backside via openings O7 and serve as backside vias 432. Subsequently, a backside MLI structure 300 is formed over the backside vias 432 and the backside ILD layer 410. The resulting structure is illustrated in FIG. 33. Exemplary details of the CMP process for forming the backside vias 432 are discussed previously with respect to that for forming the backside vias 292 as illustrated in FIG. 24, and thus they are not repeated herein for the sake of brevity. Exemplary forming methods and materials of the backside MLI structure 300 are discussed previously with respect to FIG. 25, and thus they are not repeated herein for the sake of brevity.

In the depicted embodiment of FIG. 33, the backside vias 432 each have a first portion 4321 having a tapered profile with a width decreasing as a distance from the source epitaxial structure 190S increases; a second portion 4322 over the first portion 4321 and having a tapered profile with a width decreasing as a distance from the source epitaxial structure 190S decreases; a third portion 4323 over the second portion 4322 and having vertical sidewalls and a width keeping uniform as a distance from the source epitaxial structure 190S increases; and a fourth portion 4324 over the third portion 4323 and having a tapered profile with a width decreasing as a distance from the source epitaxial structure 190S increases.

In some embodiments where the previous etch back process performed on the backside ILD layer 410 stops at the level height 403*h* between topmost and bottommost positions of the vertical facet 403 (See FIG. 30), the backside vias 432 are free from the fourth tapered portions 4324. In that scenario, the top portions of the backside vias 432 are the third portions 4323 having vertical sidewalls and the largest widths, which in turn increases contact area with the backside power rail 305, thus reducing contact resistance and further reducing RC time delay.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that backside vias and backside metal lines (e.g., backside power rails) can be formed on a backside of transistors, which in turn allows for more routing space and hence higher routing density. Another advantage is that one or more backside dielectric layers laterally surrounding the backside vias and/or backside metal lines have one or more air gaps therein, which in turn reduces capacitive coupling among the backside vias and/or backside metal lines, thus resulting in reduced RC time delay.

In some embodiments, an integrated circuit (IC) structure includes a gate structure, a source epitaxial structure, a drain epitaxial structure, a front-side interconnection structure, a backside dielectric layer, and a backside via. The source epitaxial structure and the drain epitaxial structure are respectively on opposite sides of the gate structure. The front-side interconnection structure is on a front-side of the source epitaxial structure and a front-side of the drain epitaxial structure. The backside dielectric layer is on a backside of the source epitaxial structure and a backside of the drain epitaxial structure and has an air gap therein. The backside via extends through the backside dielectric layer to a first one of the source epitaxial structure and the drain epitaxial structure.

In some embodiments, an IC structure includes a plurality of first channel layers, a plurality of second channel layers, a first gate structure, a second gate structure, first and second source epitaxial structures, a drain epitaxial structure, front-side interconnection structure, first and second backside vias, and a dielectric layer. The plurality of first channel layers are arranged one above another in a spaced apart manner, and the plurality of second channel layers arranged on above another in a spaced apart manner as well. The first gate structure surrounds each of the plurality of first channel layers, and a second gate structure surrounds each of the plurality of second channel layers. The first source epitaxial structure and the drain epitaxial structure are respectively on opposite end surfaces of the plurality of first channel layers. The second source epitaxial structure and the drain epitaxial structure are respectively on opposite end surfaces of the plurality of second channel layers. The front-side interconnection structure is on a front-side of the first source epitaxial structure, a front-side of the drain epitaxial structure and a front-side of the second source epitaxial structure. The first backside via and the second backside via are respectively on a backside of the first source epitaxial structure and a backside of the second source epitaxial structure. The dielectric layer laterally surrounds the first backside via and the second backside via and has an air gap laterally between the first backside via and the second backside via.

In some embodiments, a method includes etching a recess in a substrate; forming a sacrificial epitaxial plug in the recess in the substrate; forming a source epitaxial structure and a drain epitaxial structure over the substrate, wherein one of the source epitaxial structure and the drain epitaxial structure is formed over the sacrificial plug; forming a gate structure laterally between the source epitaxial structure and the drain epitaxial structure; removing the substrate such that the sacrificial epitaxial plug protrudes from a backside of the one of the source epitaxial structure and the drain epitaxial structure; forming a dielectric layer over the sacrificial epitaxial plug, the dielectric layer having an air gap therein; removing the sacrificial epitaxial plug to form a backside via opening extending through the dielectric layer; and forming a backside via in the backside via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    etching a recess in a substrate, wherein the substrate comprises a first material;
    forming a plug in the recess in the substrate, wherein the plug comprises a second material different than the first material;
    forming an epitaxial structure over the plug;
    forming a gate structure on a first side of the substrate adjacent epitaxial structure;
    removing at least a portion of a backside of the substrate to expose the plug;
    forming a dielectric layer over the plug, the dielectric layer having an air gap therein;
    removing the plug to form a backside via opening through the dielectric layer; and
    forming a backside via in the backside via opening, wherein the backside via is electrically coupled to the epitaxial structure.

2. The method of claim 1, wherein forming the plug comprises epitaxially growing the second material, wherein the second material is a semiconductor material.

3. The method of claim 2, wherein the semiconductor material is silicon germanium.

4. The method of claim 3, wherein the semiconductor material is free of n-type dopants and p-type dopants.

5. The method of claim 3, wherein the semiconductor material comprises a first silicon germanium layer and a second silicon germanium layer, wherein the first silicon germanium layer has a different germanium concentration than the second silicon germanium layer.

6. The method of claim 5, wherein the first silicon germanium layer has a germanium atomic percentage in a range between 20% and 50%, wherein the second silicon germanium layer has a germanium atomic percentage in a range between 5% and 20%.

7. The method of claim 1, wherein the epitaxial structure is a source region or a drain region.

8. A method of forming a semiconductor device, the method comprising:
    forming a plurality of first channel layers over a substrate;
    forming a first recess in the substrate adjacent the plurality of first channel layers;
    forming a plug in the first recess;
    forming an epitaxial structure over the plug, the epitaxial structure extending along sidewalls of the plurality of first channel layers;
    forming a first gate structure surrounding one or more of the plurality of first channel layers;
    forming a front-side interconnection structure on a front-side of the substrate;
    removing at least a portion of the substrate along sidewalls of the plug;
    forming a dielectric layer along sidewalls of the plug;
    removing at least a portion of the plug to form a second recess in the dielectric layer; and
    forming a first backside via in the second recess, wherein the first backside via is electrically connected to the epitaxial structure.

9. The method of claim 8, wherein forming the plug comprises:
    forming a first layer; and
    forming a second layer over the first layer, wherein during removing the plug, the second layer has a different etch rate than the first layer.

10. The method of claim 8, wherein the dielectric layer contacts the first gate structure.

11. The method of claim 8, wherein forming the dielectric layer forms a void in the dielectric layer.

12. The method of claim 11, further comprising after forming the first backside via, forming a backside interconnection structure on the dielectric layer, wherein the void remains in the dielectric layer after forming the backside interconnection structure.

13. The method of claim 8, wherein forming the plug comprises performing a cyclic deposition-etch process.

14. The method of claim 8, wherein forming the plug comprises a selective epitaxial growth (SEG) process having a higher growth rate along a crystal plane of a bottom of the first recess than along a crystal plane of the first channel layers.

15. An integrated circuit (IC) structure comprising:
    a gate structure;
    a first epitaxial structure on a first side of the gate structure;
    a second epitaxial structure on a second side of the gate structure;
    a front-side interconnection structure on a front-side of the first epitaxial structure and a front-side of the second epitaxial structure;
    a backside dielectric layer, wherein the gate structure, the first epitaxial structure, and the second epitaxial structure are between the backside dielectric layer and the front-side interconnection structure; and
    a backside via extending through the backside dielectric layer, the backside via being electrically connected to the first epitaxial structure, wherein the backside dielectric layer extends continuously from the backside via to under the second epitaxial structure.

16. The IC structure of claim 15, further comprising a void in the backside dielectric layer.

17. The IC structure of claim 16, wherein the void laterally overlaps the second epitaxial structure.

18. The IC structure of claim 15, wherein a width of the backside via in a cross-sectional view decreases as the backside via extends away from the first epitaxial structure.

19. The IC structure of claim 15, further comprising a silicide region between the backside via and the first epitaxial structure.

20. The IC structure of claim 19, wherein the second epitaxial structure is free of a silicide region on a surface facing the backside dielectric layer.

* * * * *